United States Patent
Park et al.

(10) Patent No.: US 10,411,348 B2
(45) Date of Patent: Sep. 10, 2019

(54) PHASE SHIFTING DEVICE

(71) Applicants: LG ELECTRONICS INC., Seoul (KR); KOREA ADVANCED INSTITUTE OF SCIENCE AND TECHNOLOGY, Daejeon (KR)

(72) Inventors: Jinseok Park, Daejeon (KR); Song-Cheoll Hong, Daejeon (KR); Seung Hoon Kang, Daejeon (KR); Jaehoon Chung, Seoul (KR); Minki Ahn, Seoul (KR)

(73) Assignees: LG ELECTRONICS INC., Seoul (KR); KOREA ADVANCED INSTITUTE OF SCIENCE AND TECHNOLOGY, Daejeon (KR)

( * ) Notice: Subject to any disclaimer, the term of this patent is extended or adjusted under 35 U.S.C. 154(b) by 2 days.

(21) Appl. No.: 15/868,953

(22) Filed: Jan. 11, 2018

(65) Prior Publication Data
US 2018/0198206 A1 Jul. 12, 2018

(30) Foreign Application Priority Data
Jan. 11, 2017 (KR) .................. 10-2017-0004302

(51) Int. Cl.
| | |
|---|---|
| *H03D 7/14* | (2006.01) |
| *H03D 7/16* | (2006.01) |
| *H01Q 3/34* | (2006.01) |
| *H01P 1/18* | (2006.01) |
| *H03H 11/20* | (2006.01) |

(Continued)

(52) U.S. Cl.
CPC .................. *H01Q 3/34* (2013.01); *H01P 1/18* (2013.01); *H03H 11/20* (2013.01)

(58) Field of Classification Search
CPC .......... H03D 7/14; H03D 7/1458; H03D 7/16; H03D 7/165; H04B 1/00; H04B 1/0071; H04B 1/04; H01Q 3/34
USPC ...... 375/316; 455/127, 313, 323; 333/25, 26
See application file for complete search history.

(56) References Cited

U.S. PATENT DOCUMENTS

| 7,336,940 B2 * | 2/2008 | Smithson ................. H03C 3/40 455/302 |
| 8,693,961 B2 * | 4/2014 | Oliaei .................. H03F 1/0222 455/114.2 |

(Continued)

*Primary Examiner* — Dean O Takaoka
(74) *Attorney, Agent, or Firm* — Lee, Hong, Degerman, Kang & Waimey PC

(57) ABSTRACT

Provided is a phase shifting device including a first balun outputting first and second differential input signals, an I/Q generator outputting first to fourth phase signals based on the first and second differential input signals, a control circuit outputting a first control signal, a second control signal, a plurality of in-phase select signals, and a plurality of quadrature select signals, a current source circuit including a first source transistor outputting an in-phase current according to the first control signal and a second source outputting a quadrature current according to the second control signal, a vector sum circuit outputting first and second differential output signals based on the first to fourth phase signals according to the plurality of in-phase select signals and the plurality of quadrature select signals and including a plurality of sub-vector sum circuits, and a second balun outputting an output signal.

11 Claims, 20 Drawing Sheets

(51) Int. Cl.
  *H04B 1/04* (2006.01)
  *H01Q 3/00* (2006.01)

(56) References Cited

U.S. PATENT DOCUMENTS

| | | | | |
|---|---|---|---|---|
| 8,693,970 B2* | 4/2014 | Corman | .................. | H04B 7/10 |
| | | | | 455/276.1 |
| 8,699,626 B2* | 4/2014 | Saunders | .............. | H04L 27/362 |
| | | | | 375/316 |
| 8,868,015 B2* | 10/2014 | Uehara | ................ | H04B 1/0071 |
| | | | | 455/127.4 |
| 8,957,722 B2* | 2/2015 | Zienkewicz | ........... | H03D 7/165 |
| | | | | 327/355 |

* cited by examiner

FIG. 11
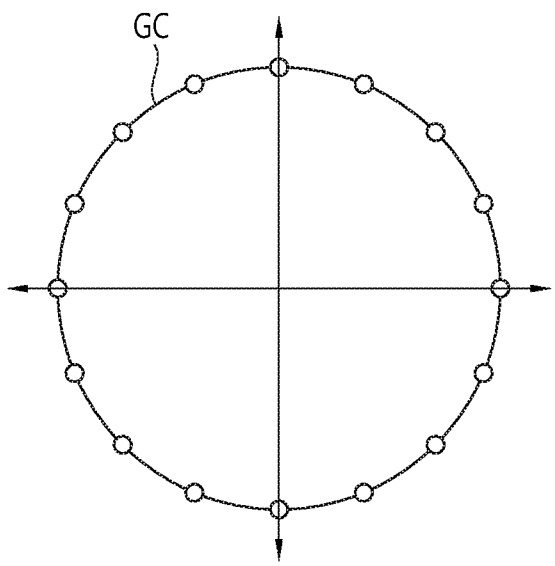
| Phase | I | Q |
|---|---|---|
| 0° | 20 | 0 |
| 22.5° | 17.2 | 2.8 |
| 45° | 10 | 10 |
| 67.5° | 2.8 | 17.2 |
(mA)
(a)
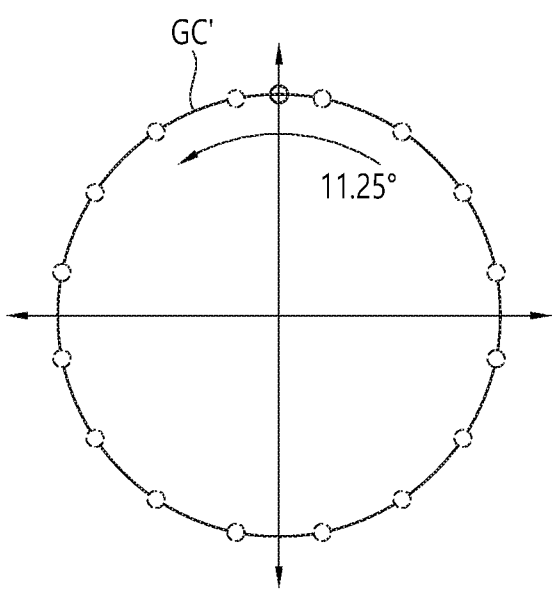
| Phase | I | Q |
|---|---|---|
| 11.25° | 19 | 1 |
| 33.75° | 14.6 | 5.4 |
| 56.25° | 5.4 | 14.6 |
| 78.75° | 1 | 19 |
(mA)
(b)

PHASE SHIFTING DEVICE

CROSS-REFERENCE TO RELATED APPLICATIONS

Pursuant to 35 U.S.C. § 119(a), this application claims the benefit of earlier filing date and right of priority to Korean Patent Application No. 10-2017-0004302, filed on Jan. 11, 2017, the contents of which are hereby incorporated by reference herein in its entirety.

BACKGROUND OF THE INVENTION

Field of the Invention

The present invention relates to a phase shifting device and, more particularly, to a phase shifting device for beamforming.

Related Art

A phase shifter is a device used for shifting a phase of a signal. In order to implement a beamforming technique using a multi-array antenna, a phase shifter coupled to an antenna is required.

For instance, schemes of implementing a phase shifter include a switching type, a reflection type, and a vector sum type. In the case of implementing a phase shifter in a high frequency region, advantages and disadvantages of each scheme and limitations of devices used in designing are required to be considered.

The switching type and the reflection type phase shifters are easy to implement and consume less power. However, the switching type and the reflection type phase shifters have shortcomings in that an insertion loss is large and input/output matching characteristics are varied depending on a phase state.

SUMMARY OF THE INVENTION

The present invention provides a phase shifting device having enhanced performance based on enhanced integration and enhanced matching characteristics.

In an aspect, a phase shifting device for beamforming is provided. The phase shifting device according to an embodiment includes: a first balun outputting first and second differential input signals based on an input signal; an I/Q generator outputting first to fourth phase signals based on the first and second differential input signals; a control circuit outputting a first control signal, a second control signal, a plurality of in-phase select signals, and a plurality of quadrature select signals; a current source circuit including a first source transistor outputting an in-phase current according to the first control signal and a second source transistor outputting a quadrature current according to the second control signal; a vector sum circuit outputting first and second differential output signals based on the first to fourth phase signals according to the plurality of in-phase select signals and the plurality of quadrature select signals and including a plurality of sub-vector sum circuits; and a second balun outputting an output signal based on the first and second differential output signals.

BRIEF DESCRIPTION OF THE DRAWINGS

FIG. 11 is a vector diagram of a phase shifting device according to another embodiment of the present disclosure.

DESCRIPTION OF EXEMPLARY EMBODIMENTS

The above-mentioned characteristics and following detailed descriptions are exemplary details to assist in both descriptions and understanding of this disclosure. That is, this disclosure may be embodied in different forms, without being limited to such embodiments. The following embodiments are illustrative only to fully disclose the present disclosure and described to deliver the present disclosure to those skilled in the art to which the present disclosure pertains. Therefore, in case where several methods are provided to implement the components of the present disclosure, the present disclosure may be implemented by any of a specific one of the methods or a method identical thereto.

When it is mentioned that a configuration includes specific elements in this disclosure or when it is mentioned that a certain process includes specific steps, it may mean that any other elements or any other steps may be further included. That is, the terms used herein are merely intended to describe particular embodiments and are not intended to limit the concepts of the present disclosure. Further, examples described to help understanding of the invention include complementary embodiments thereof.

Terms used herein shall have the meaning understood by those skilled in the art to which the present invention pertains. The commonly used terms should be interpreted to have a meaning consistent according to a context of the present disclosure. In addition, the terms used herein should not be construed as ideal or excessively formal meanings, unless otherwise clearly defined. Embodiments of the present disclosure will be described with reference to the accompanying drawings.

Figure 1:
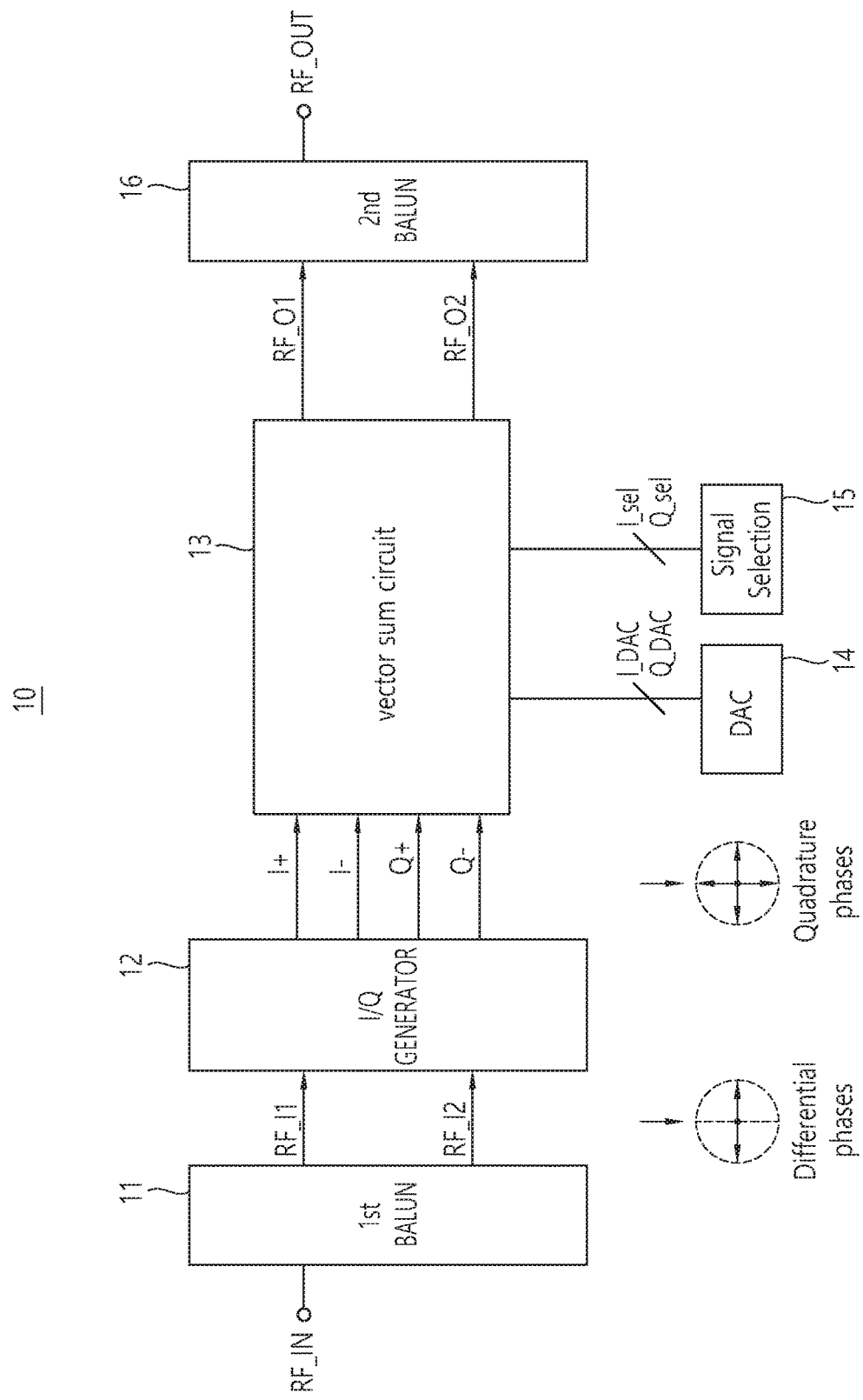
FIG. 1 is a block diagram illustrating a structure of a related art vector sum type phase shifting device.

FIG. 1 is a block diagram illustrating a structure of the related art vector sum type phase shifting device. Referring to FIG. 1, a phase shifting device 10 may include a first balun 11, an I/Q generator 12, a vector sum circuit 13, a digital-to-analog converter (DAC) 14, a signal selection circuit 15, and a second balun 16.

The first balun 11 may output first and second differential input signals RF_I1 and RF_I2 based on an input signal RF_IN. For example, the first and second differential input signals RF_I1 and RF_I2 have a phase difference of 180°.

The I/Q generator 12 may generate first to fourth phase signals having a phase difference of 90° based on the differential signals RF_I1 and RF_I2. For example, a first phase signal I+ has a phase of 0°, and a second phase signal I− has a phase of 180°. A third phase signal Q+ has a phase of 90°, and a fourth phase signal Q− has a phase of 270°.

Figure 2:
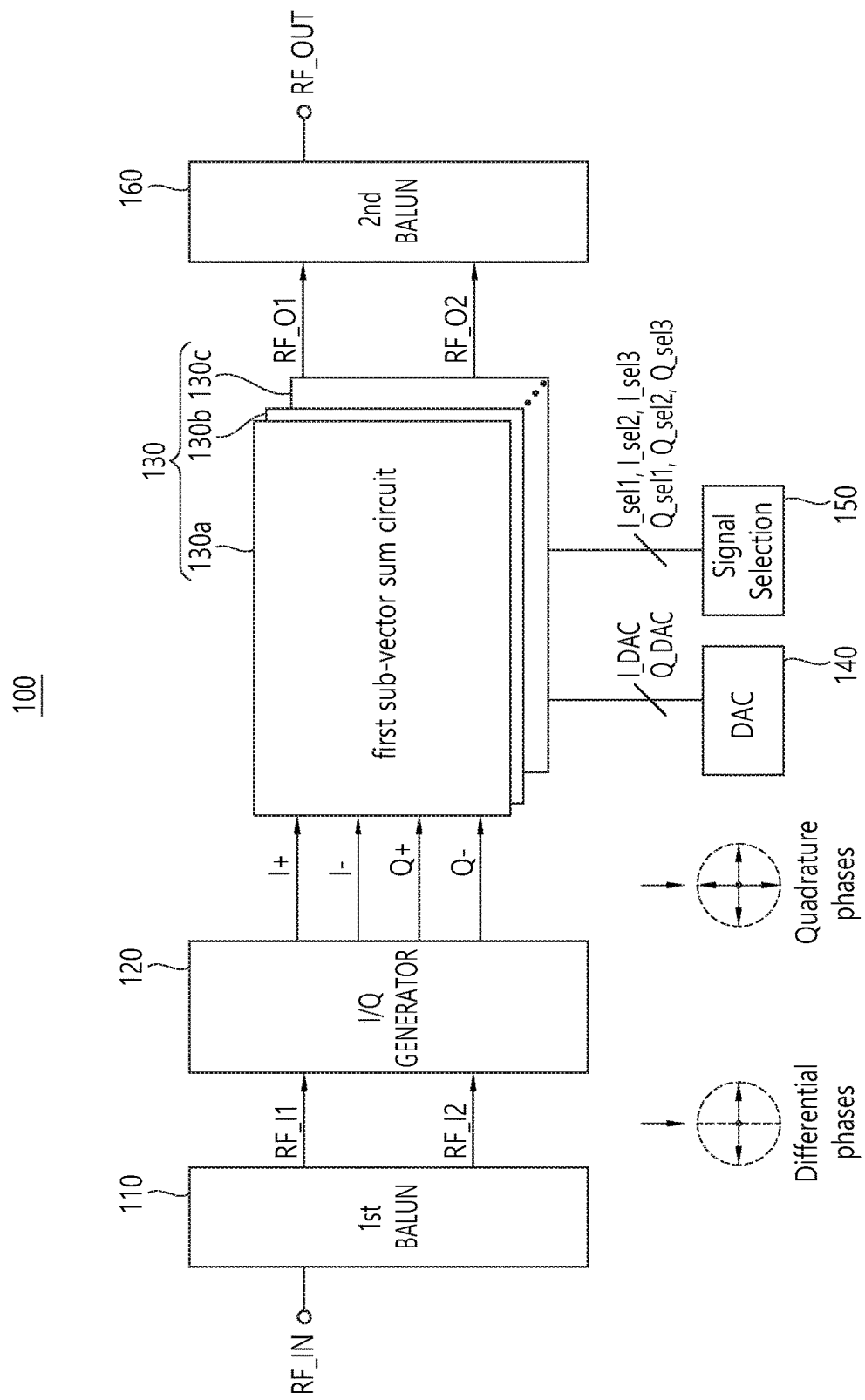
FIG. 2 is a block diagram illustrating a vector sum type phase shifting device according to an embodiment of the present disclosure.

For example, when the input signal RF_IN of FIG. 2 is 5*cos(wt), the first to fourth phase signals I+, I−, Q+, Q− of FIG. 3 may be as follows.

The first phase signal I+ may be 5*cos(wt), and the second phase signal I− may be −5*cos(wt). The third phase signal Q+ may be 5*sin(wt), and the fourth phase signal Q− may be −5*sin(wt). In this case, 'w' may refer to a frequency of the input signal RF_IN.

A signal having a phase difference of 0° or 180° from the input signal RF_IN is referred to as an in-phase (I) signal. A signal having a phase difference of 90° or 270° from the input signal RF_IN is referred to as a quadrature (Q) signal.

The vector sum circuit 13 may output first and second differential output signal RF_O1 and RF_O2 according to a plurality of control signals I_DAC, Q_DAC, I_sel, and Q_sel based on the first to fourth phase signals I+, I−, Q+, and Q−.

The DAC circuit 14 may output first and second control signals I_DAC and Q_DAC to the vector sum circuit 13. The signal selection circuit 15 may output the first and second select signals and Q_sel to the vector sum circuit 13.

The second balun 16 may output an output signal RF_OUT based on the first and second differential output signals RF_O1 and RF_O2.

FIG. 2 is a block diagram illustrating a vector sum type phase shifting device according to an embodiment of the present invention.

Referring to FIGS. 1 and 2, the phase shifting device 100 of FIG. 2 includes a first balun 110, an I/Q generator 120, a vector sum circuit 130, a DAC circuit 140, a signal selection circuit 150, and a second balun 160.

The first balun 110 of FIG. 2 corresponds to the first balun 11 of FIG. 1, and a description thereof may be replaced with the contents described above with reference to FIG. 1. The I/Q generator 120 of FIG. 2 corresponds to the I/Q generator 12 of FIG. 1, and a description thereof may be replaced with the contents described above with reference to FIG. 1.

The vector sum circuit 130 may include a plurality of sub-vector sum circuits. For example, the vector sum circuit 130 of FIG. 2 may include first to third sub-vector sum circuits 130a to 130c.

Magnitudes of in-phase (I) currents output through the first to third sub-vector sum circuits 130a to 130c may be individually set. Also, magnitudes of quadrature (Q) currents output through the first to third sub-vector sum circuits 130a to 130c of FIG. 2 may be individually set. An internal structure of the sub-vector sum circuits according to the present embodiment will be described in detail with reference to the drawings described hereinafter.

The vector sum circuit 130 may output first and second differential output signals RF_O1 and RF_O2 based on a plurality of control signals I_DAC, Q_DAC, I_sel1, I_sel2, I_sel3, Q_sel1, Q_sel2 and Q_sel3. The first to third sub-vector sum circuits 130a to 130c may be commonly controlled according to the first and second control signals I_DAC and Q_DAC.

The vector sum circuit 130 may be controlled based on first to third in-phase select signals I_sel1, I_sel2 and I_sel3 and first to third quadrature select signals Q_sel1, Q_sel2 and Q_sel3.

For example, the first sub-vector sum circuit 130a may be controlled based on the first in-phase select signal I_sel1 and the first quadrature select signal Q_sel1. The second sub-vector sum circuit 130b may be controlled based on the second in-phase select signal I_sel2 and the second quadrature select signal Q_sel2. The third sub-vector sum circuit 130c may be controlled based on the third in-phase select signal I_sel3 and the third quadrature select signal Q_sel3.

The DAC circuit 140 may output the first and second control signals I_DAC and Q_DAC to the vector sum circuit 130.

The signal selection circuit 150 may output the first to third in-phase select signals I_sel1, I_sel2 and I_sel3 and the first to third quadrature select signals Q_sel1, Q_sel2 and Q_sel3 to the vector sum circuit 130. In this disclosure, a combination of the DAC circuit 140 and the signal selection circuit 150 may be referred to as a control circuit.

The second balun 160 may output an output signal RF_OUT based on the first and second differential output signals RF_O1 and RF_O2.

Figure 3:
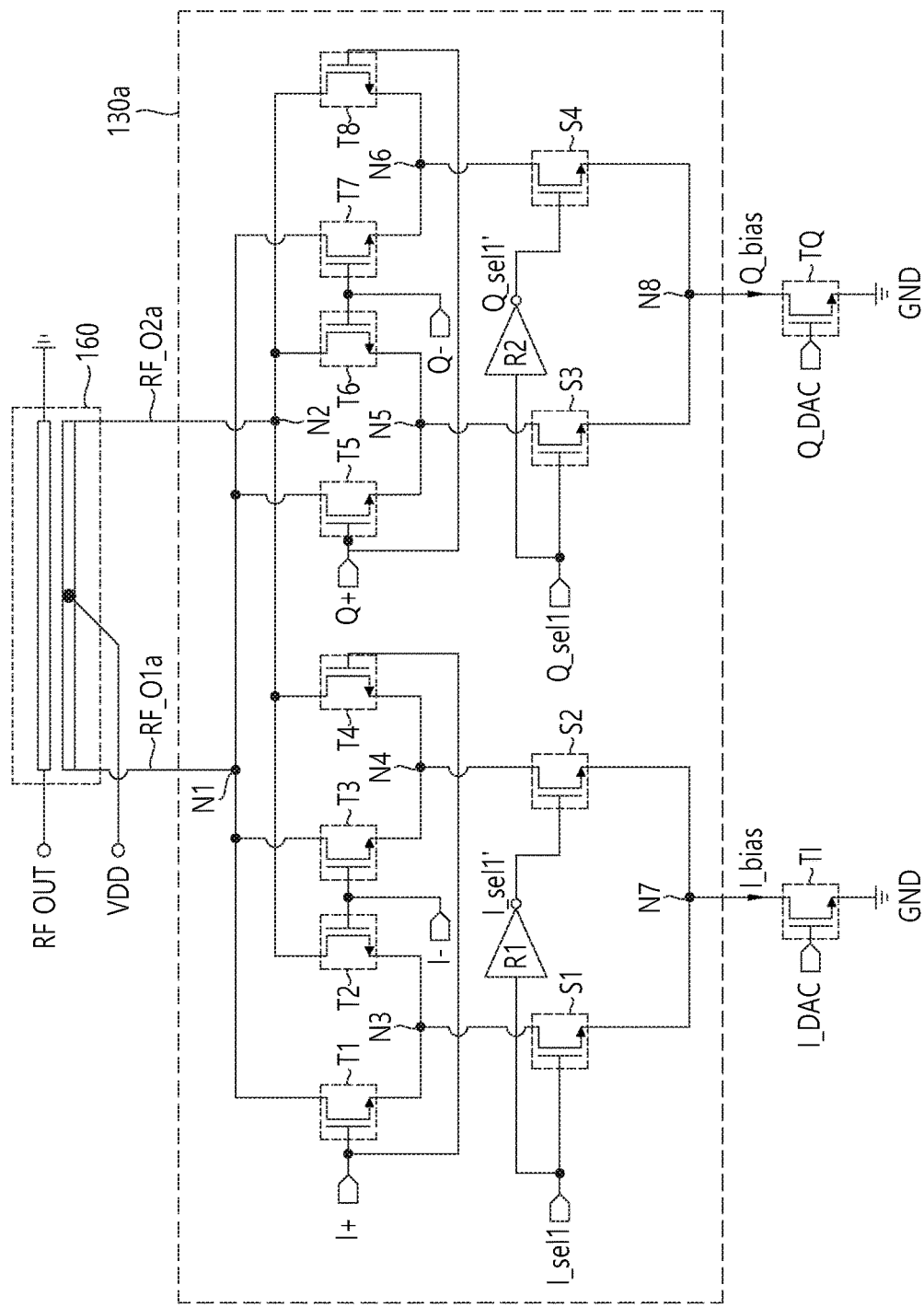
FIG. 3 is a view illustrating part of a vector sum circuit according to an embodiment of the present disclosure.

FIG. 3 is a view illustrating part of a vector sum circuit according to an embodiment of the present invention. Referring to FIG. 2 and FIG. 3, an internal structure of the first sub-vector sum circuit 130a of the vector sum circuit 130 is illustrated in the embodiment of the present invention.

The first sub-vector sum circuit 130a of FIG. 3 may be connected to an in-phase transistor TI and a quadrature transistor TQ. In this disclosure, a configuration including the in-phase transistor TI and the quadrature transistor TQ may be referred to as a current source circuit.

For example, the in-phase transistor TI may output an in-phase bias current I_bias. The quadrature transistor TQ may output a quadrature bias current Q_bias. The in-phase transistor TI and the quadrature transistor TQ of FIG. 3 may operate as a current source.

The first sub-vector sum circuit 130a may include first to eighth transistors T1 to T8 corresponding to the first to fourth phase signals I+, I−, Q+, and Q−. The first sub-vector sum circuit 130a may include first and second selection transistors S1 and S2 corresponding to a first in-phase select signal I_sel1 and a first in-phase inversion select signal I_sel1'. Also, the first sub-vector sum circuit 130a may include third and fourth selection transistors S3 and S4 corresponding to a first quadrature select signal Q_sel1 and a first quadrature inversion select signal Q_sel1'.

One end of the first transistor T1 is connected to a first node N1 and the other end thereof is connected to a third node N3. The first phase signal I+ is applied to a gate of the first transistor T1. One end of the second transistor T2 is connected to a second node N2 and the other end thereof is connected to a third node N3. The second phase signal I− is applied to a gate of the second transistor T2.

One end of the third transistor T3 is connected to the first node N1 and the other end thereof is connected to a fourth node N4. The second phase signal I− is applied to a gate of the third transistor T3. One end of the fourth transistor T4 is connected to the second node N2 and the other end thereof is connected to the fourth node N4. The first phase signal I+ is applied to a gate of the fourth transistor T4.

One end of a fifth transistor T5 is connected to the first node N1 and the other end thereof is connected to a fifth node N5. The third phase signal Q+ is applied to a gate of the fifth transistor T5. One end of the sixth transistor T6 is connected to the second node N2 and the other end thereof is connected to the fifth node N5. The fourth phase signal Q− is applied to a gate of the sixth transistor T6.

One end of a seventh transistor T7 is connected to the first node N1 and the other end thereof is connected to a sixth node N6. The fourth phase signal Q− is applied to a gate of the seventh transistor T7. One end of the eighth transistor T8 is connected to the second node N2 and the other end thereof is connected to the sixth node N6. The third phase signal Q+ is applied to the gate of the eighth transistor T8.

One end of the first selection transistor S1 is connected to the third node N3 and the other end thereof is connected to a seventh node N7. The first in-phase select signal I_sel1 is applied to a gate of the first selection transistor S1.

One end of the second selection transistor S2 is connected to the fourth node N4 and the other end thereof is connected to the seventh node N7. The first in-phase inversion select signal I_sel1', an output signal of the first inverter R1, is applied to a gate of the second selection transistor S2.

Whether to turn on the first selection transistor S1 may be determined according to signal levels of the first in-phase select signal I_sel1. Whether to turn on the second selection transistor S2 may be determined according to signal levels of the first in-phase inversion select signal I_sel1'.

For example, the first in-phase select signal I_sel1 may be a high-level signal, and the first in-phase inversion select signal I_sel1' may be a low-level signal. Accordingly, the first selection transistor S1 may be turned on and the second selection transistor S2 may be turned off.

Conversely, the first in-phase select signal I_sel1 may be a low-level signal and the first in-phase inversion select signal I_sel1' may be a high-level signal. Accordingly, the first selection transistor S1 may be turned off and the second selection transistor S2 may be turned on.

One end of the third selection transistor S3 may be connected to the fifth node N5 and the other end thereof may be connected to an eighth node N8. Also, the first quadrature select signal Q_sel1 may be applied to a gate of the third selection transistor S3.

One end of the fourth selection transistor S4 is connected to the sixth node N6 and the other end thereof is connected to the eighth node N8. The first quadrature inversion select signal Q_sel1', an output signal of the second inverter R2, is applied to a gate of the fourth selection transistor S4.

Whether to turn on the third selection transistor S3 may be determined according to signal levels of the first quadrature select signal Q_sel1. Whether to turn on the fourth selection transistor S4 may be determined according to signal levels of the first quadrature inversion select signal Q_sel1'.

For example, the first quadrature select signal Q_sel1 may be a high-level signal and the first quadrature inversion select signal Q_sel1' may be a low-level signal. Accordingly, the third selection transistor S3 is turned on and the fourth selection transistor S4 is turned off.

Conversely, the first quadrature select signal Q_sel1 may be a low-level signal and the first quadrature inversion select signal Q_sel1' may be a high-level signal. Accordingly, the third selection transistor S3 is turned off and the fourth selection transistor S4 is turned on.

One end of the in-phase transistor TI is connected to the seventh node N7 and the other end thereof is connected to a ground node GND. Also, the first control signal I_DAC is applied to the gate of the in-phase transistor TI.

A magnitude of the in-phase bias current I_bias flowing at one end of the in-phase transistor TI may be controlled according to signal levels of the first control signal I_DAC. For example, as the signal level of the first control signal I_DAC increases, the magnitude of the in-phase bias current I_bias may increase.

One end of the quadrature transistor TQ is connected to the eighth node N8 and the other end thereof is connected to the ground node GND. Also, the second control signal Q_DAC is applied to the gate of the quadrature transistor TQ.

A magnitude of the quadrature bias current Q_bias flowing at one end of the quadrature transistor TQ may be controlled according to signal levels of the second control signal Q_DAC. For example, as the signal level of the second control signal Q_DAC increases, the magnitude of the quadrature bias current Q_bias may increase.

A magnitude of a current vector obtained by adding the in-phase bias current I_bias and the quadrature bias current Q_bias according to the embodiment of the present invention is uniform.

The first node N1 is a point where one end of the first transistor T1, one end of the third transistor T3, one end of the fifth transistor T5, and one end of the seventh transistor T7 intersect. The first node N1 may be connected to the second balun 160 through the first output terminal RF_O1a.

The second node N2 is a point where one end of the second transistor T2, one end of the fourth transistor T4, one end of the sixth transistor T6, and one end of the eighth transistor T8 intersect. The second node N2 may be connected to the second balun 160 through the second output terminal RF_O2a.

The third node N3 is a point where the other end of the first transistor T1, the other end of the second transistor T2, and one end of the first selection transistor S1 intersect.

The fourth node N4 is a point where the other end of the third transistor T3, the other end of the fourth transistor T4, and one end of the second selection transistor S2 intersect.

The fifth node N5 is a point where the other end of the fifth transistor T5, the other end of the sixth transistor T6, and one end of the third selection transistor S3 intersect.

The sixth node N6 is a point where the other end of the seventh transistor T7, the other end of the eighth transistor T8, and one end of the fourth selection transistor S4 intersect.

The seventh node N7 is a point where the other end of the first selection transistor S1, the other end of the second selection transistor S2, and one end of the in-phase transistor TI intersect.

The eighth node N8 is a point where the other end of the third selection transistor S3, the other end of the fourth selection transistor S4, and one end of the quadrature transistor TQ intersect.

Figure 4:
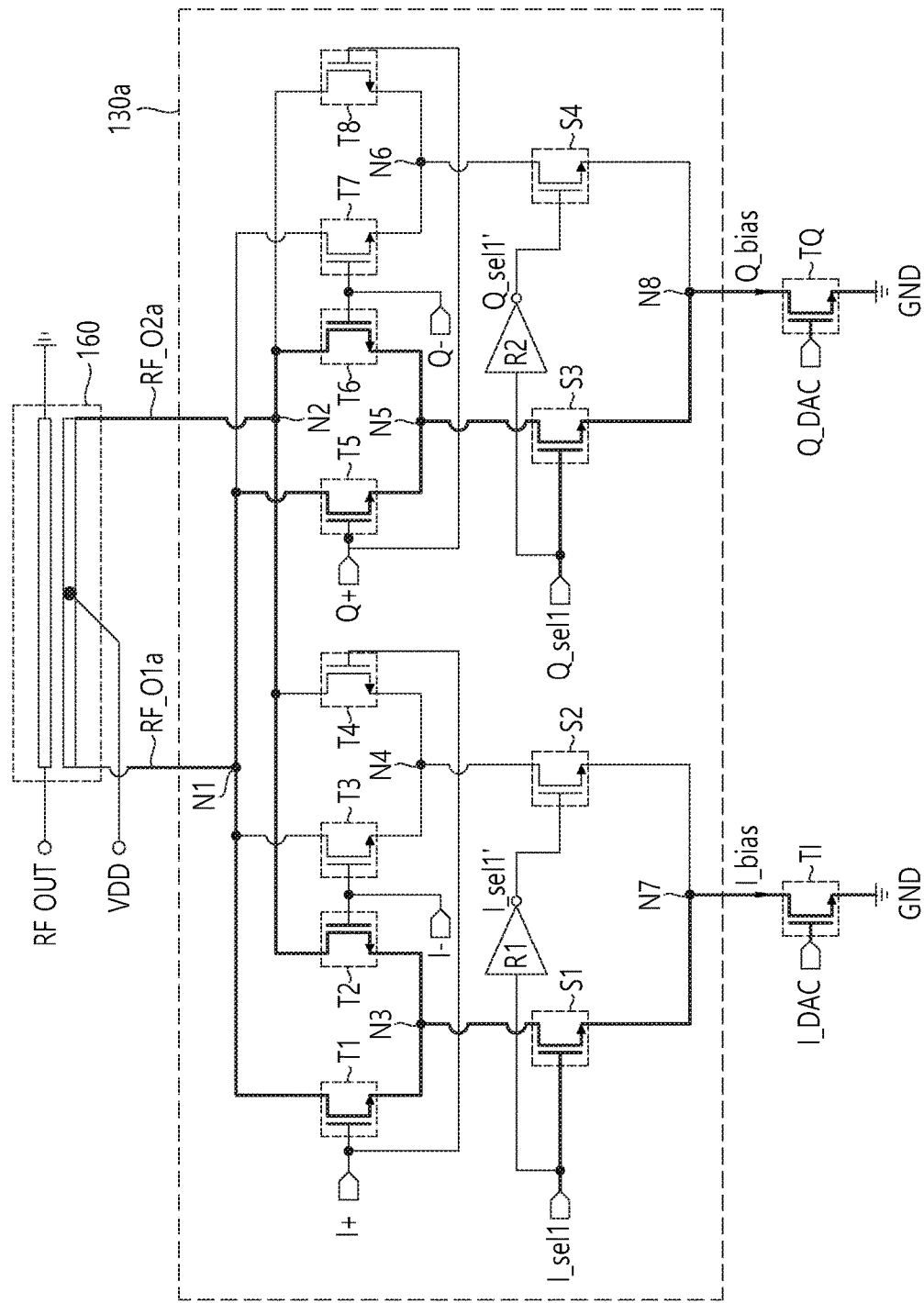
FIG. 4 is a view illustrating an ON/OFF operation of a sub-vector sum circuit according to an embodiment of the present disclosure.

FIG. 4 is a view illustrating ON/OFF operation of a sub-vector sum circuit according to an embodiment of the present invention. Referring to FIGS. 1 to 4, the in-phase component I may be set separately from the quadrature component Q.

The first control signal I_DAC is applied to the gate of the in-phase transistor TI. A magnitude of a current I_bias flowing at one end of the in-phase transistor TI may be determined based on the first control signal I_DAC.

The second control signal Q_DAC is applied to the gate of the quadrature transistor TQ. A magnitude of the current Q_bias flowing at one end of the quadrature transistor TQ may be determined based on the second control signal Q_DAC.

In a first case, it is assumed that the second control signal Q_DAC is applied with a magnitude of '0'. Accordingly, the current Q_bias does not flow at one end of the quadrature transistor TQ.

It is assumed that the first in-phase select signal I_sel1 having a high level is applied to the gate of the first selection transistor 51. The remaining select signal I_sel1' may be a low-level signal.

In the first case, however, it may be understood that, since the magnitude of the second control signal Q_DAC is '0', the output signal RF_OUT is determined regardless of level of the select signals Q_sel1 and Q_sel1' associated with a quadrature component.

For example, the first quadrature select signal Q_sel1 may have a high level and the first quadrature inversion select signal Q_sel1' may have a low level. Alternatively, the first quadrature inversion select signal Q_sel1' may have a high level and the first quadrature select signal Q_sel1 may have a low level.

Since the first selection transistor S1 is turned on, the first transistor T1 and the second transistor T2 may be selected. Accordingly, the first transistor T1 may transmit a signal generated based on the first phase signal I+ to the first output terminal RF_O1a. The second transistor T2a may transmit a signal generated based on the second phase signal I− to the second output terminal RF_O2a.

In a second case, it is assumed that the first control signal I_DAC is applied with a magnitude of '0'. Accordingly, the current I_bias does not flow at one end of the in-phase transistor TI.

It is assumed that the first quadrature select signal Q_sel1 having a high level is applied to the gate of the third selection transistor S3. The remaining select signal Q_sel1' may be a low-level signal In the second case, however, it may be understood that, since the magnitude of the first control signal I_DAC is '0', the output signal RF_OUT is determined regardless of level of the select signals I_sel1 and I_sel1'.

For example, the first in-phase select signal I_sel1 may have a high level and the first in-phase inversion select signal I_sel1' may have a low level. Alternatively, the first in-phase inversion select signal I_sel1' may have a high level, and the first in-phase select signal I_sel1 may have a low level.

Since the third selection transistor S3 is turned on, the fifth transistor T5 and the sixth transistor T6 may be selected.

Accordingly, the fifth transistor T5 may transmit a signal generated based on the third phase signal Q+ to the first output terminal RF_O1a. The sixth transistor T6 may output a signal generated based on the fourth phase signal Q− to the second output terminal RF_O2a.

The second balun 160 of FIG. 4 may receive a signal output from the first sub-vector sum circuit 130a through the first and second output terminals RF_O1a and RF_O2a. Although not shown in FIG. 4, the second balun 160 of FIG. 4 may output an output signal RF_OUT obtained by combining all of signals output from output terminals (not shown) of any other sub-vector sum circuits, as well as the first and second output terminals RF_O1a and RF_O2a.

In addition to the first case and the second case described above, various combinations of selection transistors that are turned on or off according to signal levels of a plurality of individually controlled select signals may be possible.

Figure 5:
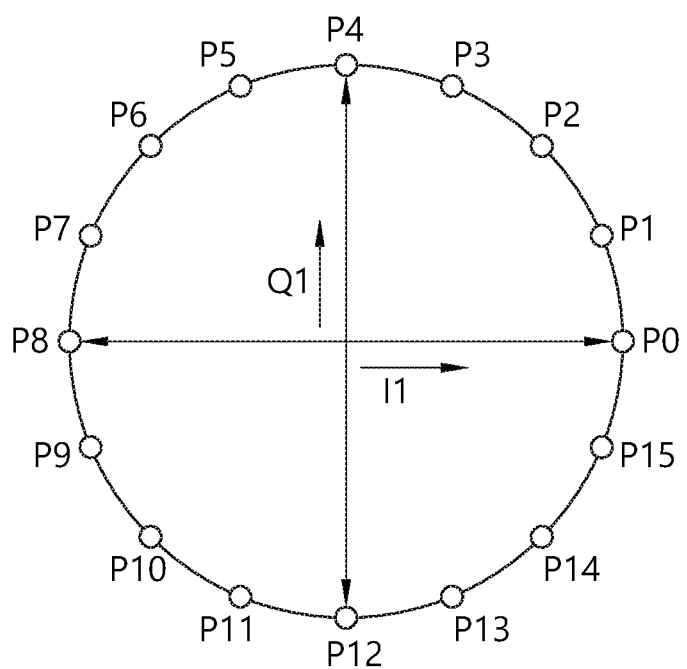
FIG. 5 is a vector diagram of a sub-vector sum circuit according to an embodiment of the present disclosure.

FIG. 5 is a vector diagram of a sub-vector sum circuit according to an embodiment of the present disclosure.

Referring to FIGS. 1 to 5, the phase shifting device according to the present embodiment may generate a signal having successive phases P0 to P15 from 0° to 360° by adjusting the plurality of control signals I_sel1, I_sel1', Q_sel1, Q_sel1', I_DAC, and Q_DAC associated with the first sub-vector circuit.

For example, P0 corresponds to phase 0°, P4 corresponds to phase 90°, P8 corresponds to phase 180°, and P12 corresponds to phase 270°.

In order to clarify FIG. 5, it is assumed that the transistors T1, T2, S1, and TI belonging to the first sub-vector sum circuit 130a are turned on and the quadrature transistor TQ is turned off as in the first case of FIG. 4. In this case, the first in-phase vector I1 on the horizontal axis of the vector diagram of FIG. 5 may correspond to an output signal of the first sub-vector sum circuit 130a of FIG. 4.

As in the second case of FIG. 4, it is assumed that the transistors T5, T6, S3 and TQ belonging to the first sub-vector sum circuit 130a are turned on and the in-phase transistor TI is turned off. In this case, the first quadrature vector Q1 on the vertical axis of the vector diagram of FIG. 5 may correspond to an output signal of the first sub-vector sum circuit 130a of FIG. 4.

Figure 6A:
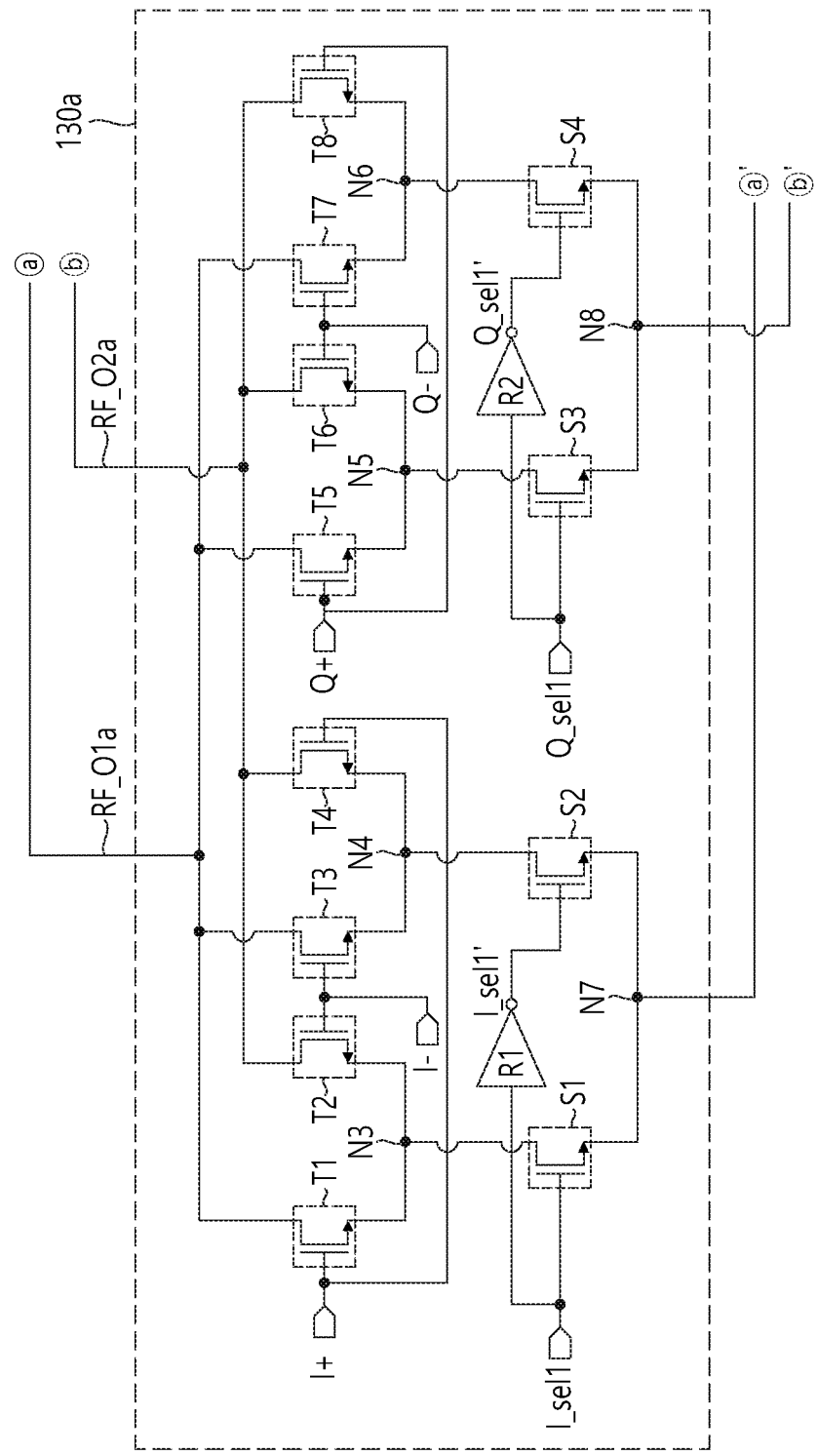
FIGS. 6A to 6C are views illustrating the entire structure of a vector sum circuit according to an embodiment of the present disclosure.
Figure 6B:
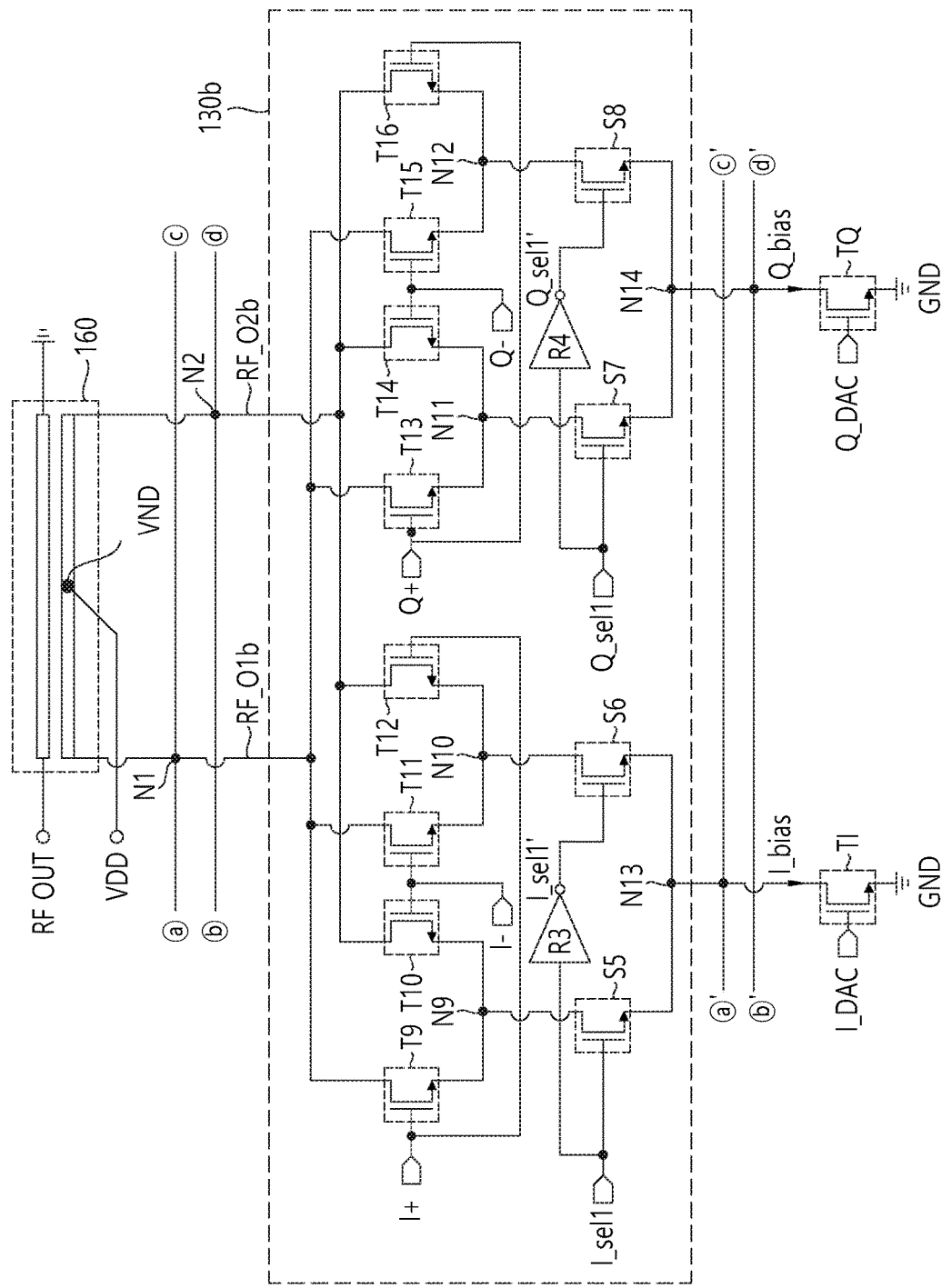
Figure 6C:
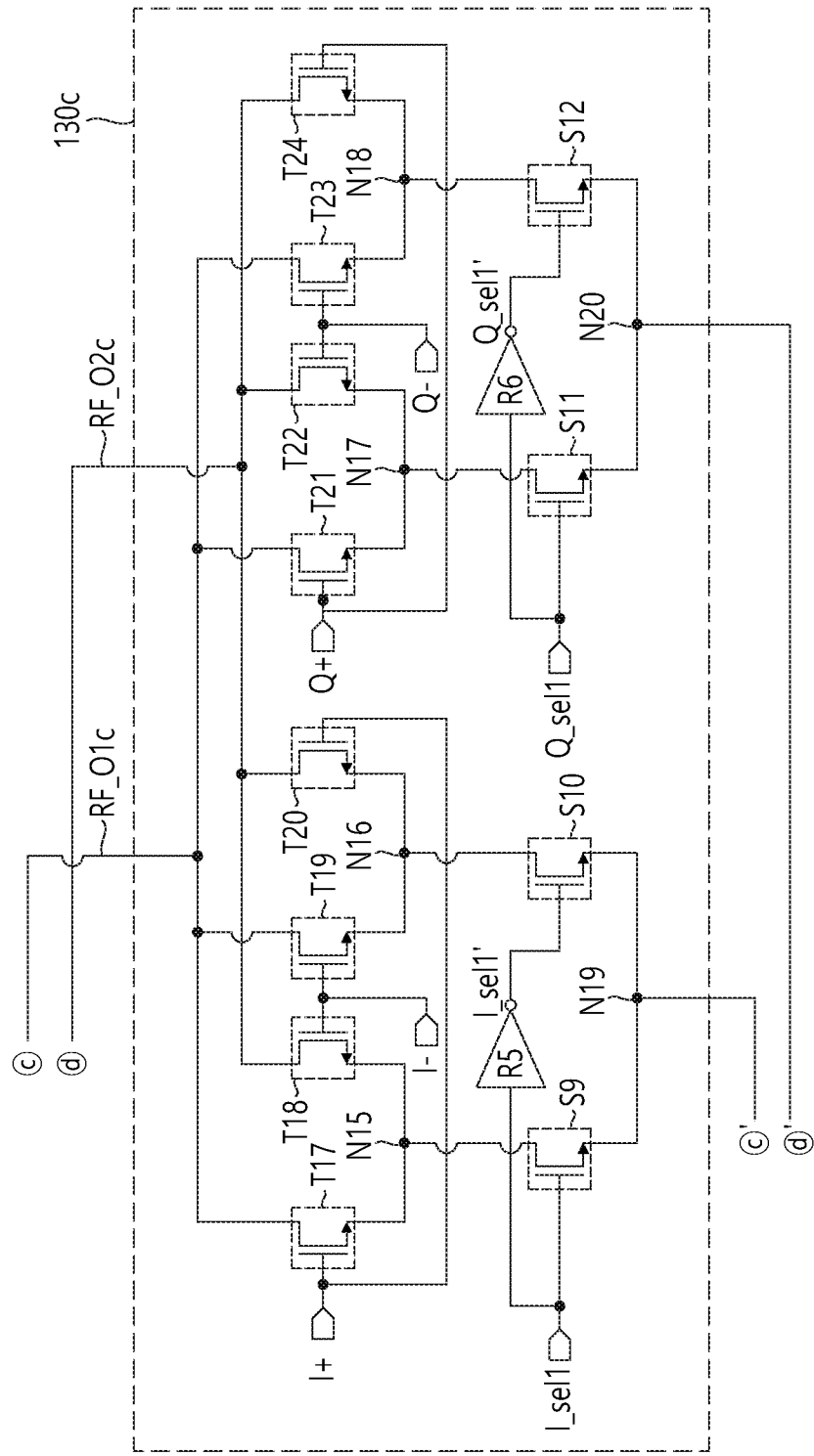

FIGS. 6A to 6C are views illustrating the entire structure of a vector sum circuit according to an embodiment of the present disclosure.

Referring to FIGS. 6A to 6C, it is assumed that three sub-vector sum circuits constitute a vector sum circuit. However, FIGS. 6A to 6C are merely an example of a vector sum circuit of the present disclosure and It will be appreciated that the vector sum circuit according to embodiments of the present disclosure may include two sub-vector sum circuits or may include four or more sub-vector sum circuits.

Referring to FIGS. 1 to 4 and 6A to 6C, the first to third sub-vector sum circuits 130a, 130b and 130c may be understood as individual modules. Transistors located at the same positions in the first to third sub-vector sum circuits 130a, 130b, and 130c have the same connection relationship. Therefore, it will be understood that descriptions of the connection relationship of the other remaining sub-vector sum circuits 130b and 130c may be replaced with the description of the connection relationship of the transistors included in the first sub-vector sum circuit 130a.

A size ratio of the sub-vector sum circuits illustrated in FIGS. 6A to 6C may be individually set. That is, the size ratio of the sub-vector sum circuits may be determined according to ratios of a gate width W of the transistor disposed at the same position in each sub-vector sum circuit.

For example, the first transistor T1 of the first sub-vector sum circuit 130a, the ninth transistor T9 of the second sub-vector sum circuit 130b, and the seventeenth transistor T17 of the third sub-vector sum circuit are disposed at the same position. As is well known, a magnitude of a drain current Id flowing at a drain of a transistor is proportional to a gate width W of the transistor. For clear and concise descriptions of FIGS. 6A to 6C, a size ratio of the first sub-vector sum circuit 130a, the second sub-vector sum circuit 130b, and the third sub-vector sum circuit 130c in FIGS. 6A to 6C is assumed to be 1.5:2.5:3.

For example, a ratio of a gate width W1 of the first transistor T1 included in the first sub-vector sum circuit 130a, a gate width W9 of the ninth transistor T9 included in the second sub-vector sum circuit 130b, and a gate width W17 of the seventeenth transistor T17 included in the third sub-vector sum circuit 130c may be 1.5:2.5:3.

Similarly, a gate width W2 of the second transistor T2 included in the first sub-vector sum circuit 130a, a gate width W10 of the gate of the tenth transistor T10 included in the second sub-vector sum circuit 130b, and a gate width W18 of the eighteenth transistor T18 included in the third sub-vector sum circuit 130c may be 1.5:2.5:3.

A ratio of magnitudes of a signal output from one end of the first transistor T1 of the first sub-vector sum circuit 130a based on the first phase signal I+, a signal output from one end of the ninth transistor T9 of the second sub-vector sum circuit 130b based on the first phase signal I+, and a signal output from one end of the first transistor T17 of the third sub-vector sum circuit 130c based on the first phase signal I+ may be 1.5:2.5:3.

It will be appreciated that, through the above example, the ratio of widths of the transistors at the same location may be 1.5:2.5:3, even without mentioning all the transistors. In other words, the ratio of gate widths of other transistors present at the same position in each sub-vector sum circuit is set to 1.5:2.5:3 as above.

In the phase shifting device according to the present embodiment, magnitudes of signals output from the respective sub-vector sum circuits may be set to be different based on the ratio of the gate width of each transistor included in each sub-vector sum circuit.

It will be appreciated that the size ratio of the first to third sub-vector sum circuits 130a, 130b, and 130c may be set to a different size ratio (e.g., 2:3:3).

Hereinafter, it is assumed that the size ratio of the first sub-vector sum circuit 130a is greater than that of the second sub-vector sum circuit 130b and the size ratio of the second sub-vector sum circuit 130b is greater than that of the third sub-vector sum circuit 130c.

Accordingly, a magnitude of a signal output from the first sub-vector sum circuit 130a may be greater than a magnitude of a signal output from the second sub-vector sum circuit 130b. Also, a magnitude of a signal output from the second sub-vector sum circuit 130b may be greater than a magnitude of a signal output from the third sub-vector sum circuit 130c. Details thereof will be described in detail with reference to the accompanying drawings hereinafter.

Figure 7A:
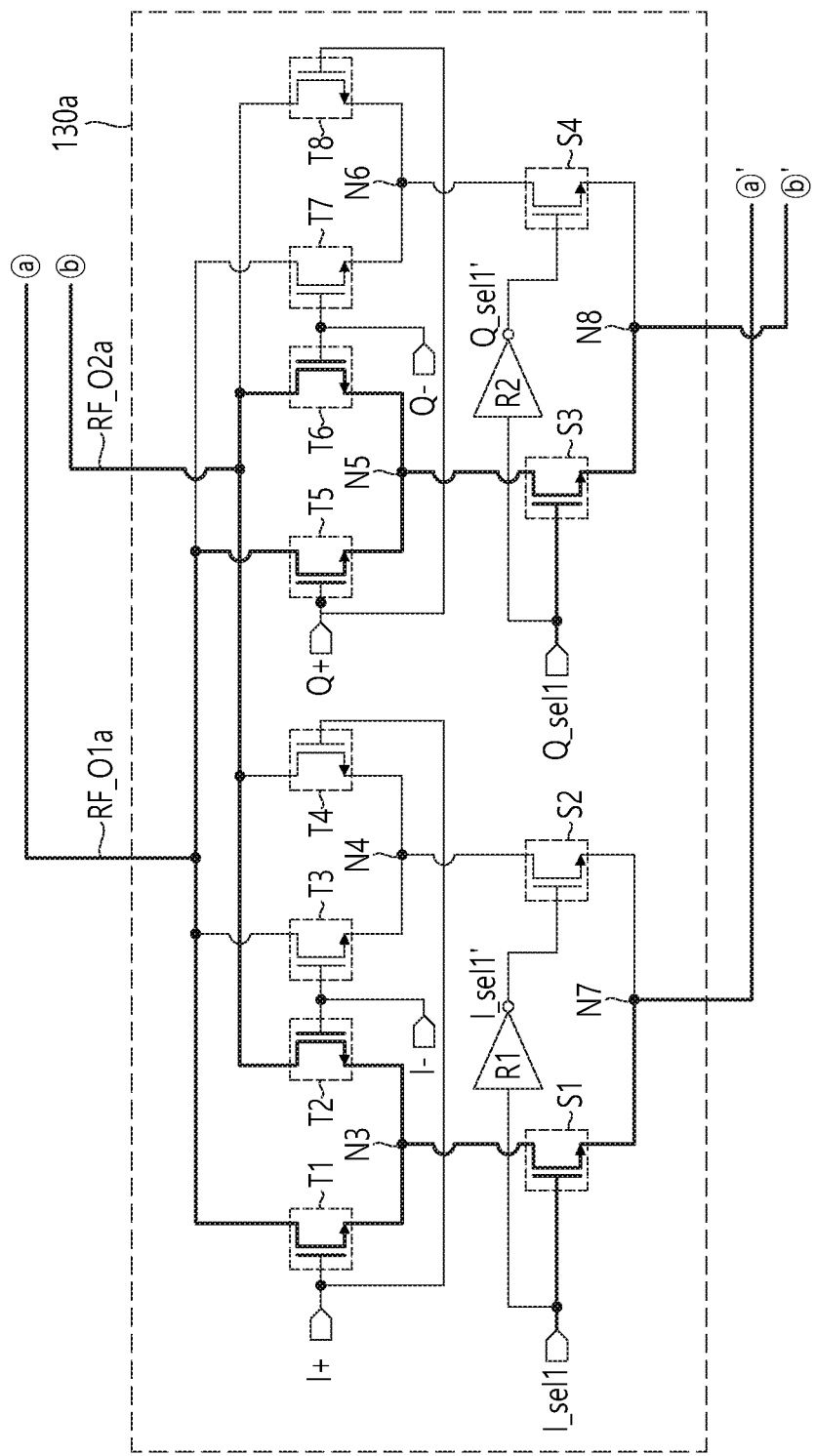
FIGS. 7A to 7C are views illustrating ON/OFF operations in the entire structure of a vector sum circuit according to an embodiment of the present disclosure.
Figure 7B:
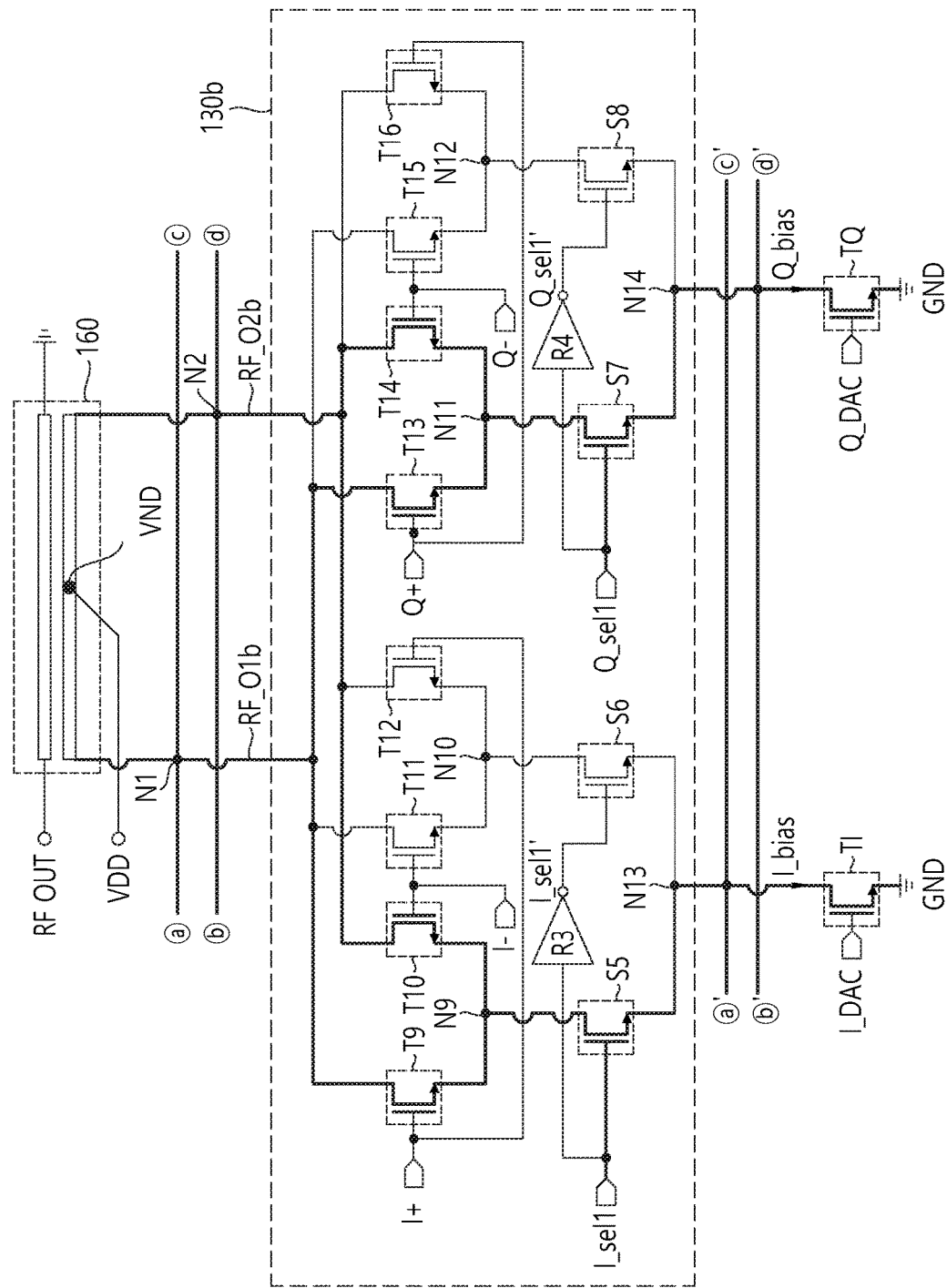
Figure 7C:
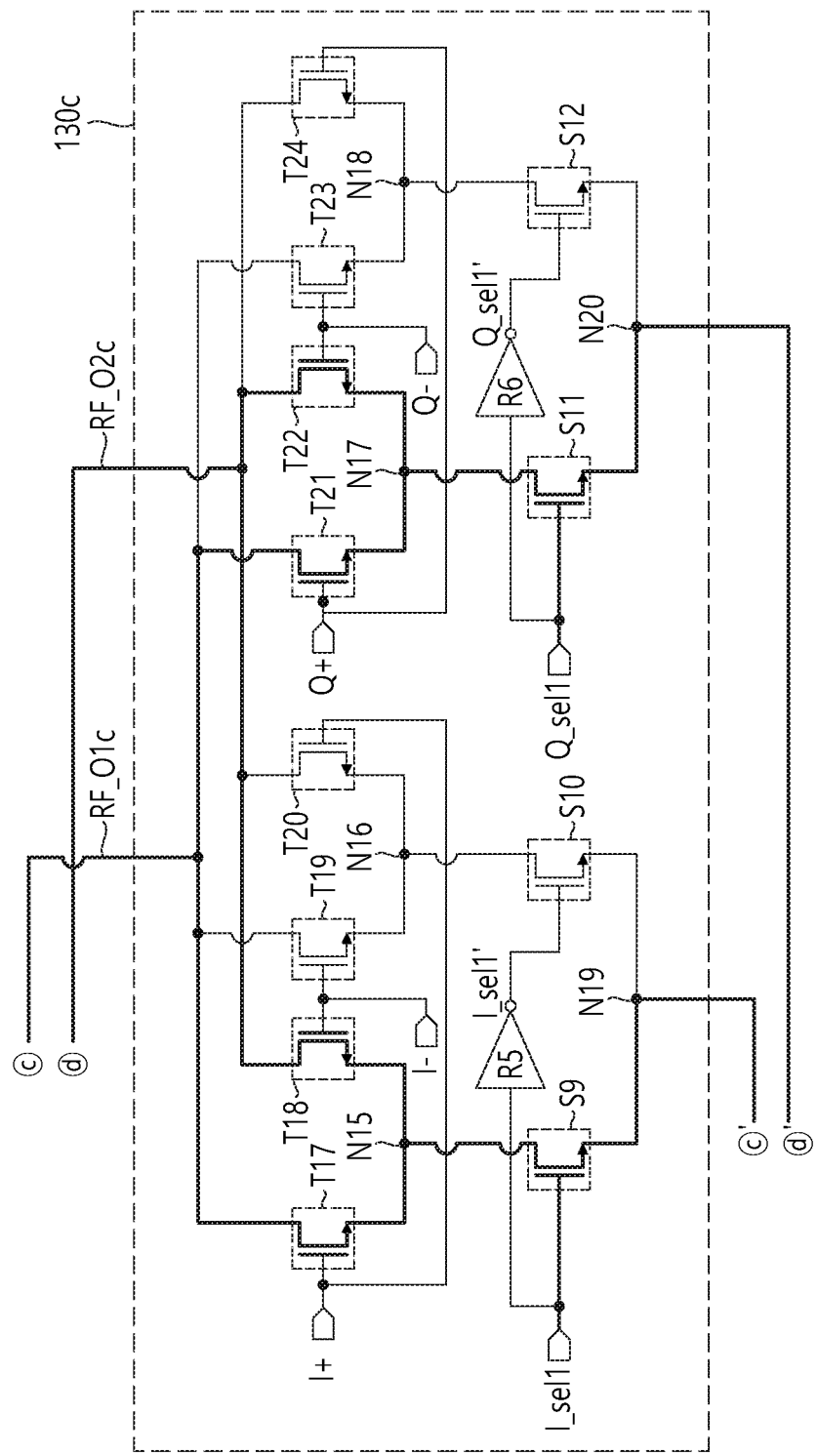

FIGS. 7A to 7C are views illustrating ON/OFF operations in the entire structure of a vector sum circuit according to an embodiment of the present disclosure.

As described above, in the following description, it is assumed that the size ratio of the first sub-vector sum circuit 130a is greater than the size ratio of the second sub-vector sum circuit 130b and the size ratio of the second sub-vector sum circuit 130b is greater than the size ratio of the third sub-vector sum circuit 130c.

One end of the in-phase transistor TI of FIGS. 7A to 7C is connected to the seventh node N7, the thirteenth node N13, and the nineteenth node N19 and the other end thereof is connected to the ground node (GND). The first control signal I_DAC is applied to the gate of the in-phase transistor TI.

The size of the in-phase bias current I_bias flowing at one end of the in-phase transistor TI may be controlled according to signal levels of the first control signal I_DAC.

For example, as the signal level of the first control signal I_DAC increases, the in-phase bias current I_bias may increase. Conversely, as the signal level of the first control signal I_DAC decreases, the in-phase bias current I_bias may decrease.

One end of the quadrature transistor TQ is connected to the eighth node N8, the fourteenth node N14, and the twentieth node N20 and the other end thereof is connected to the ground node GND. Also, the second control signal Q_DAC is applied to the gate of the quadrature transistor TQ.

A magnitude of the quadrature bias current Q_bias flowing at one end of the quadrature transistor TQ may be controlled according to signal levels of the second control signal Q_DAC.

For example, as the signal level of the second control signal Q_DAC increases, the magnitude of the quadrature bias current Q_bias may increase. Conversely, as the signal level of the second control signal Q_DAC decreases, the magnitude of the quadrature bias current Q_bias may decrease.

The phase shifting device according to the present disclosure may uniformly adjust a magnitude of a signal obtained by adding the in-phase bias current I_bias and the quadrature bias current Q_bias based on the first control signal I_DAC and the second control signal Q_DAC.

In a third case, it is assumed that the magnitude of the second control signal Q_DAC is '0'. Accordingly, the current Q_bias does not flow at one end of the quadrature transistor TQ.

In the third case, it may be understood that, since the magnitude of the second control signal Q_DAC is '0', the output signal RF_OUT is determined, regardless of level of the select signals Q_sel1, Q_sel1', Q_sel2, Q_sel2', Q_sel3 and Q_sel3' associated with the quadrature component.

In the first sub-vector sum circuit 130a, it is assumed that a high-level first in-phase select signal I_sel1 is applied to the gate of the first selection transistor S1. The remaining select signal I_sel1' may be a low-level signal.

Since the first selection transistor S1 is turned on, the first transistor T1 and the second transistor T2 may be selected. Accordingly, the first transistor T1 may transmit a signal generated based on the first phase signal I+ to the first output terminal RF_O1a. The second transistor T2 may transmit a signal generated based on the second phase signal I− to the second output terminal RF_O2a.

In the second sub-vector sum circuit 130b, it is assumed that a high-level second in-phase select signal I_sel2 is applied to the gate of the fifth selection transistor S5. The remaining select signal I_sel2' may be a low-level signal.

Since the fifth selection transistor S5 is turned on, the ninth transistor T9 and the tenth transistor T10 may be selected. Accordingly, the ninth transistor T9 may transmit a signal generated based on the first phase signal I+ to the third output terminal RF_O1b. The tenth transistor T10 may transmit a signal generated based on the second phase signal I− to the fourth output terminal RF_O2b.

In the third sub-vector sum circuit 130c, it is assumed that a high-level third in-phase select signal I_sel3 is applied to the gate of the ninth selection transistor S9. It may be assumed that the remaining select signal I_sel3' is a low-level signal.

Since the ninth selection transistor S9 is turned on, the seventeenth transistor T17 and the eighteenth transistor T18 may be selected. Accordingly, the seventeenth transistor T17 may transmit a signal generated based on the first phase signal I+ to the fifth output terminal RF_O1c. The eighteenth transistor T18 may transmit a signal generated based on the second phase signal I− to the sixth output terminal RF_O2c.

In a fourth case, it is assumed that the first control signal I_DAC is applied with a magnitude of '0'. Accordingly, the current I_bias does not flow at one end of the in-phase transistor TI.

In the fourth case, it may be understood that, since the magnitude of the first control signal I_DAC is '0', the output signal RF_OUT is determined, regardless of level of the select signals I_sel1, I_sel1', I_sel2, I_sel2', I_sel3, and I_sel3'.

In the first sub-vector sum circuit 130a, it is assumed that the high-level first quadrature select signal Q_sel1 is applied to the gate of the third selection transistor S3. The remaining select signal Q_sel1' may be a low-level signal.

Since the third selection transistor S3 is turned on, the fifth transistor T5 and the sixth transistor T6 may be selected. Accordingly, the fifth transistor T5 may transmit a signal generated based on the third phase signal Q+ to the first output terminal RF_O1a. Also, the sixth transistor T6 may transmit a signal generated based on the fourth phase signal Q− to the second output terminal RF_O2a.

In the second sub-vector sum circuit 130b, it is assumed that a high-level second quadrature select signal Q_sel2 is applied to the gate of the seventh selection transistor S7. The remaining select signal Q_sel2' may be a low-level signal.

Since the seventh selection transistor S7 is turned on, the thirteenth transistor T13 and the fourteenth transistor T14 may be selected. Accordingly, the thirteenth transistor T13 may transmit a signal generated based on the third phase signal Q+ to the third output terminal RF_O1b. In addition, the fourteenth transistor T14 may transmit a signal generated based on the fourth phase signal Q− to the fourth output terminal RF_O2b.

In the third sub-vector sum circuit 130c, it is assumed that a high-level third quadrature select signal Q_sel3 is applied to the gate of the eleventh selection transistor S11. The remaining select signal Q_sel3' may be a low-level signal.

Since the eleventh selection transistor S11 is turned on, the twenty-first transistor T21 and the twenty-second transistor T22 may be selected. Accordingly, the twenty-first transistor T21 may transmit a signal generated based on the third phase signal Q+ to the fifth output terminal RF_O1c. In addition, the twenty-second transistor T22 may transmit a signal generated based on the fourth phase signal Q− to the sixth output terminal RF_O2c.

The second balun 160 of FIGS. 7A to 7C may receive a signal output through the first and second output terminals RF_O1a and RF_O2a, a signal output through the third and fourth output terminals RF_O1b and RF_O2b, and a signal output through the fifth and sixth output terminals RF_O1c and RF_O2c.

The second balun 160 of FIGS. 7A to 7C may generate an output signal RF_OUT based on all the signals received through the first to sixth output terminals RF_O1a, RF_O2a, RF_O1b, RF_O2b, RF_O1c, and RF_O2c.

Figure 8:
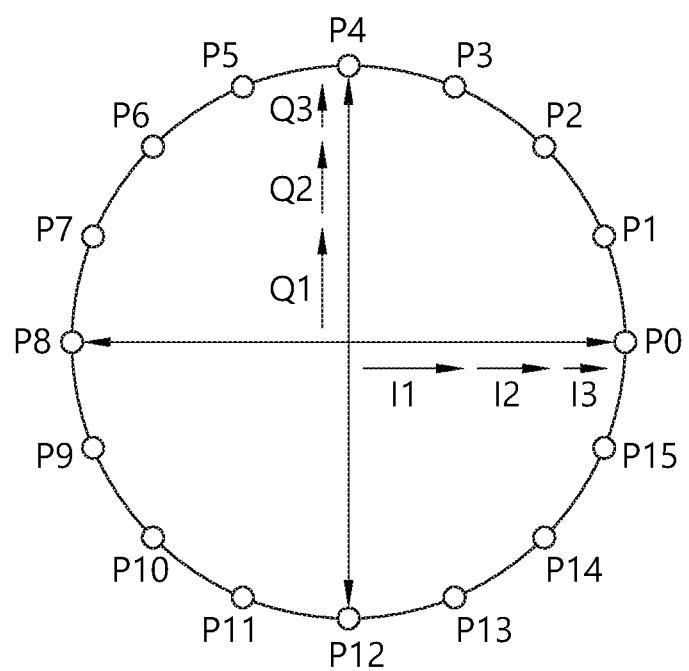
FIG. 8 is a vector diagram of a vector sum circuit according to an embodiment of the present disclosure.

FIG. 8 is a vector diagram of a vector sum circuit according to an embodiment of the present disclosure.

By adjusting the plurality of control signals I_sel1, I_sel1', Q_sel1, Q_sel1', I_sel2, I_sel2', Q_sel2, Q_sel2', I_sel3, I_sel3', Q_sel3, Q_sel3', I_DAC, and Q_DAC associated with the vector sum circuits of FIGS. 7A to 7C, the phase shifting device according to the present embodiment may generate a signal having successive phases P0 to P15 from 0° to 360° on a gain circle of FIG. 8.

The first to third in-phase vectors I1, I2, and I3 on the horizontal axis of FIG. 8 may be described based on the third case mentioned in FIGS. 7A to 7C. In detail, the first in-phase vector I1 may correspond to the in-phase component I of the first sub-vector sum circuit 130a in FIG. 7A. The second in-phase vector I2 may correspond to the in-phase component I of the second sub-vector sum circuit 130b in FIG. 7B. The third in-phase vector I3 may correspond to the in-phase component I of the third sub-vector sum circuit 130c in FIG. 7C.

The first to third quadrature vectors Q1, Q2, and Q3 of the vertical axis in FIG. 8 may be described based on the fourth case mentioned in FIGS. 7A to 7C.

Specifically, the first quadrature vector Q1 may correspond to the quadrature component Q of the first sub-vector sum circuit 130a of FIG. 7A. The second quadrature vector Q2 may correspond to the quadrature component Q of the second sub-vector sum circuit 130b of FIG. 7B. The third quadrature vector Q3 may correspond to the quadrature component Q of the third sub-vector sum circuit 130c of FIG. 7C.

A magnitude of a total current flowing in the phase shifting device according to the present embodiment may be uniformly maintained. Accordingly, an output impedance value of the phase shifting device according to the present embodiment may be kept uniformly.

The sizes of the first in-phase vector I1 and the quadrature vector Q1 of FIG. 8 are largest. The sizes of the second in phase vector I2 and the quadrature vector Q2 are medium. The sizes of the third phase vector I3 and the quadrature vector Q3 are smallest.

Also, the phase shifting device according to the present embodiment may control a gain by adjusting a direction of the in-phase component I and/or the quadrature component Q of each sub-vector sum circuit.

Directions of the first to third in-phase vectors I1, I2, and I3 of the in-phase component I of FIG. 8 are the same. In addition, directions of the first to third quadrature vectors Q1, Q2 and Q3 of the quadrature component Q are the same.

A gain of the signal output from the phase shifting device according to the present embodiment may correspond to a radius of a first gain circle GC1 having a magnitude of a vector obtained by adding the first to third in-phase vectors I1, I2 and I3. A description of gain control of the phase shifting device will be described in more detail with reference to the accompanying drawings hereinafter.

Figure 9A:
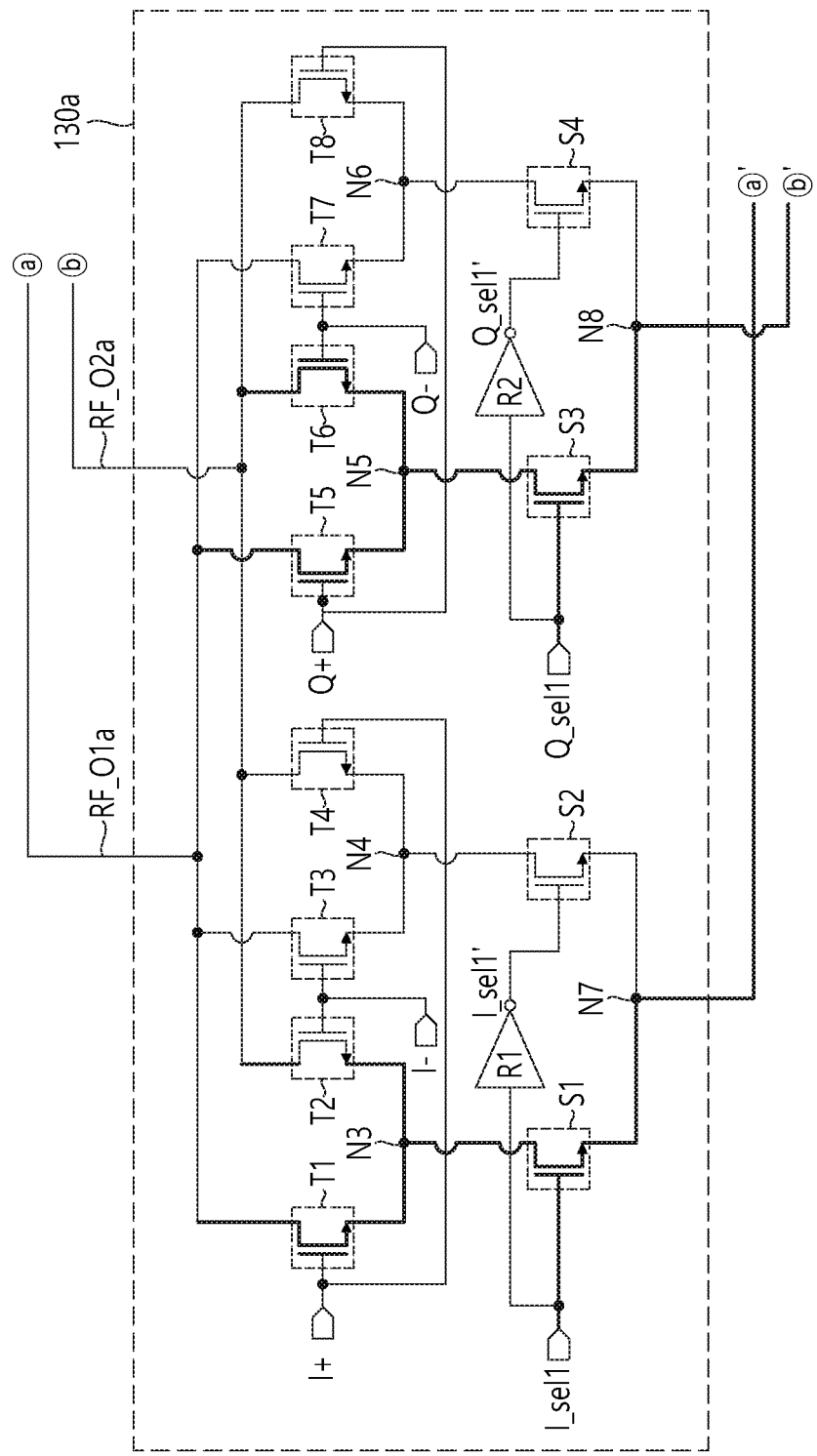
FIGS. 9A to 9C are views illustrating the entire ON/OFF operations of a vector sum circuit according to another embodiment of the present disclosure.
Figure 9B:
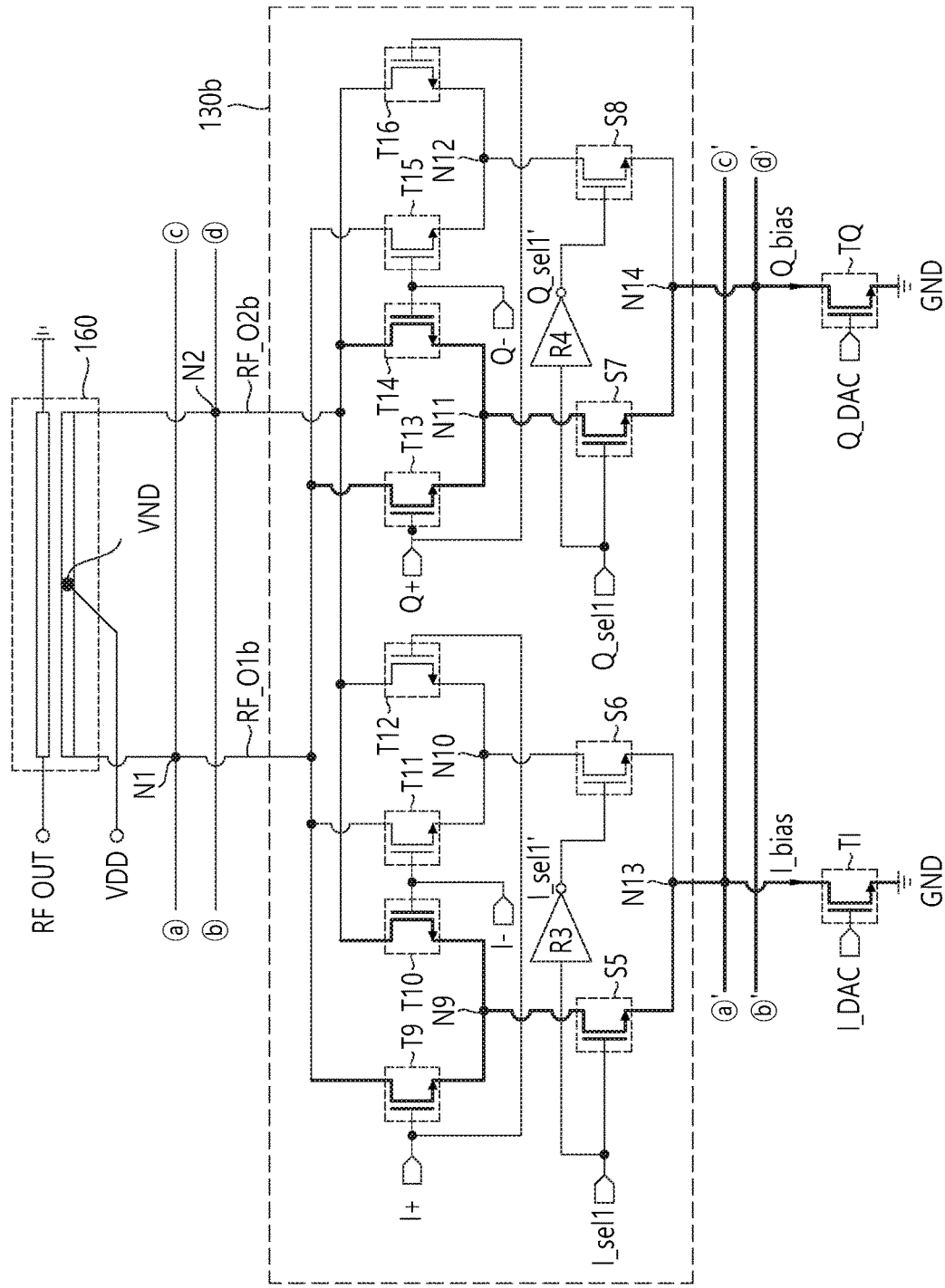
Figure 9C:
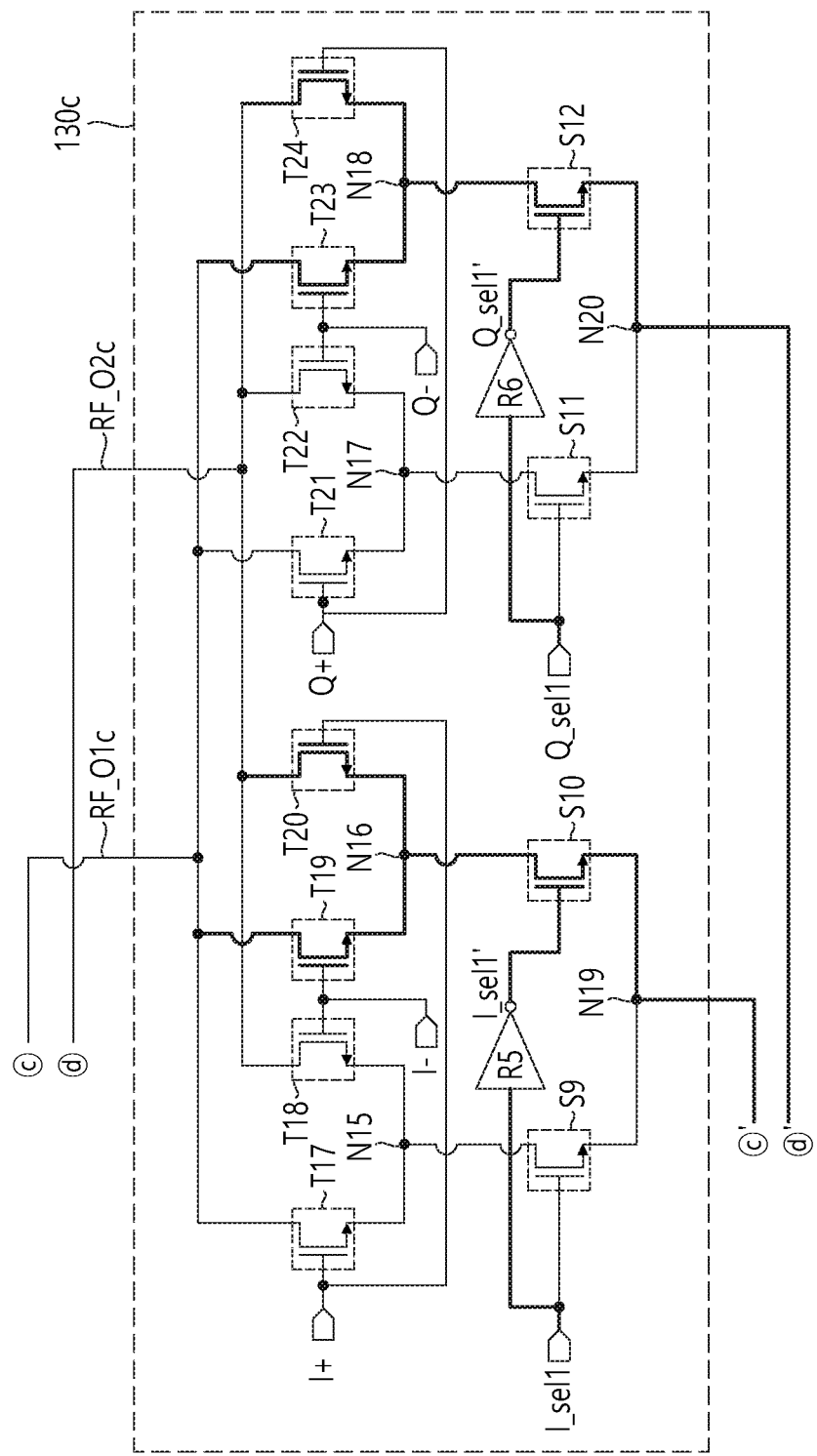

FIGS. 9A to 9C are views illustrating the entire ON/OFF operations of a vector sum circuit according to another embodiment of the present disclosure.

Referring to FIGS. 1 to 3 and FIGS. 9A to 9C, in a fifth case, it is assumed that the second control signal Q_DAC is applied with a magnitude of '0'. Accordingly, the current Q_bias does not flow at one end of the quadrature transistor TQ.

In the fifth case, it may be understood that, since the magnitude of the second control signal Q_DAC is '0', the output signal RF_OUT is determined, regardless of level of the select signals Q_sel1, Q_sel1', Q_sel2, Q_sel2', Q_sel3, and Q_sel3' associated with the quadrature component.

In the first sub-vector sum circuit 130a, it is assumed that a high-level first in-phase select signal I_sel1 is applied to the gate of the first selection transistor S1. The remaining select signal I_sel1' may be a low-level signal.

Since the first selection transistor S1 is turned on, the first transistor T1 and the second transistor T2 may be selected. Accordingly, the first transistor T1 may transmit a signal generated based on the first phase signal I+ to the first output terminal RF_O1a. The second transistor T2 may transmit a signal generated based on the second phase signal I− to the second output terminal RF_O2a. In the second sub-vector sum circuit 130b, it is assumed that a high-level in-phase select signal I_sel2 is applied to the gate of the fifth selection transistor S5. The remaining select signal I_sel2' may be a low-level signal.

Since the fifth selection transistor S5 is turned on, the ninth transistor T9 and the tenth transistor T10 may be selected. Accordingly, the ninth transistor T9 may transmit a signal generated based on the first phase signal I+ to the third output terminal RF_O1b. The tenth transistor T10 may transmit a signal generated based on the second phase signal I− to the fourth output terminal RF_O2b.

the third sub-vector sum circuit 130c, it is assumed that a low level third in-phase select signal I_sel3 is applied. Accordingly, it is assumed that a high-level third in-phase inversion select signal I_sel3' is applied to the gate of the tenth selection transistor S10.

Since the tenth selection transistor S10 is turned on, the nineteenth transistor T19 and the twentieth transistor T20 may be selected. Accordingly, the nineteenth transistor T19 may transmit a signal generated based on the second phase signal I− to the fifth output terminal RF_O1c. The twentieth transistor T20 may transmit a signal generated based on the first phase signal I+ to the sixth output terminal RF_O2c.

Considering a connection relationship between the third sub-vector sum circuit 130c and the first and second nodes N1 and N2, signals transmitted from the fifth and sixth output terminals RF_O1c and RF_O2c have a phase (i.e., 180° phase difference) opposite to that of output signals from the first and second sub-vector sum circuits 130a and 130b. In a sixth case, it is assumed that the first control signal I_DAC is applied with a magnitude of '0'. Accordingly, the current I_bias does not flow at one end of the in-phase transistor TI. In the sixth case, since the magnitude of the first control signal I_DAC is '0', the output signal RF_OUT is determined, regardless of level of the select signals I_sel1, I_sel1", I_sel2, I_sel2', I_sel3, and I_sel3'.

In the first sub-vector sum circuit 130a, it is assumed that a high-level first quadrature select signal Q_sel1 is applied to the gate of the third selection transistor S3. The remaining select signal Q_sel1' may be a low-level signal.

Since the third selection transistor S3 is turned on, the fifth transistor T5 and the sixth transistor T6 may be selected. Accordingly, the fifth transistor T5 may transmit a signal generated based on the third phase signal Q+ to the first output terminal RF_O1a. Also, the sixth transistor T6 may transmit a signal generated based on the fourth phase signal Q− to the second output terminal RF_O2a. In the second sub-vector sum circuit 130b, it is assumed that a high-level second quadrature select signal Q_sel2 is applied to the gate of the seventh selection transistor S7. The remaining select signal Q_sel2' may be a low-level signal.

Since the seventh selection transistor S7 is turned on, the thirteenth transistor T13 and the fourteenth transistor T14 may be selected. Accordingly, the thirteenth transistor T13 may transmit a signal generated based on the third phase signal Q+ to the third output terminal RF_O1b. Also, the fourteenth transistor T14 may transmit a signal generated based on the fourth phase signal Q− to the fourth output terminal RF_O2b. In the third sub-vector sum circuit 130c, it is assumed that a low-level third quadrature select signal Q_sel3 is applied. Accordingly, it is assumed that a high-level third quadrature inversion select signal Q_sel3' is applied to the gate of the twelfth selection transistor S12.

Since the twelfth selection transistor S12 is turned on, the twenty-third transistor T23 and the twenty-fourth transistor T24 may be selected. Accordingly, the twenty-third transistor T23 may transmit a signal generated based on the fourth phase signal Q− to the fifth output terminal. RF_O1c. The twenty-fourth transistor T24 may transmit a signal generated based on the third phase signal Q+ to the sixth output terminal RF_O2c. When a connection relationship between the third sub-vector sum circuit 130c and the first and second nodes N1 and N2 are considered, signals transmitted from the, fifth and sixth output terminals RF_O1c and RF_O2c has a phase (i.e., a 180° phase difference) opposite to that of output signals from the first and second sub-vector sum circuits 130a and 130b.

The second balun 160 illustrated in FIGS. 9A to 9C may receive signals through the first and second output terminals RF_O1a and RF_O2a of the first sub-vector sum circuit 130a, the third and fourth output terminals RF_O1b and RF_O2b of the second sub-vector sum circuit 130b, and the fifth and sixth output terminals RF_O1c and RF_O2c of the third sub-vector sum circuit 130c.

The second balun 160 illustrated in FIGS. 9A to 9C may output an output signal RF_OUT obtained by combining all the signals transmitted from the first to sixth output terminals RF_O1a, RF_O2a, RF_O1b, RF_O2b, RF_O1c and RF_O2c.

Figure 10:
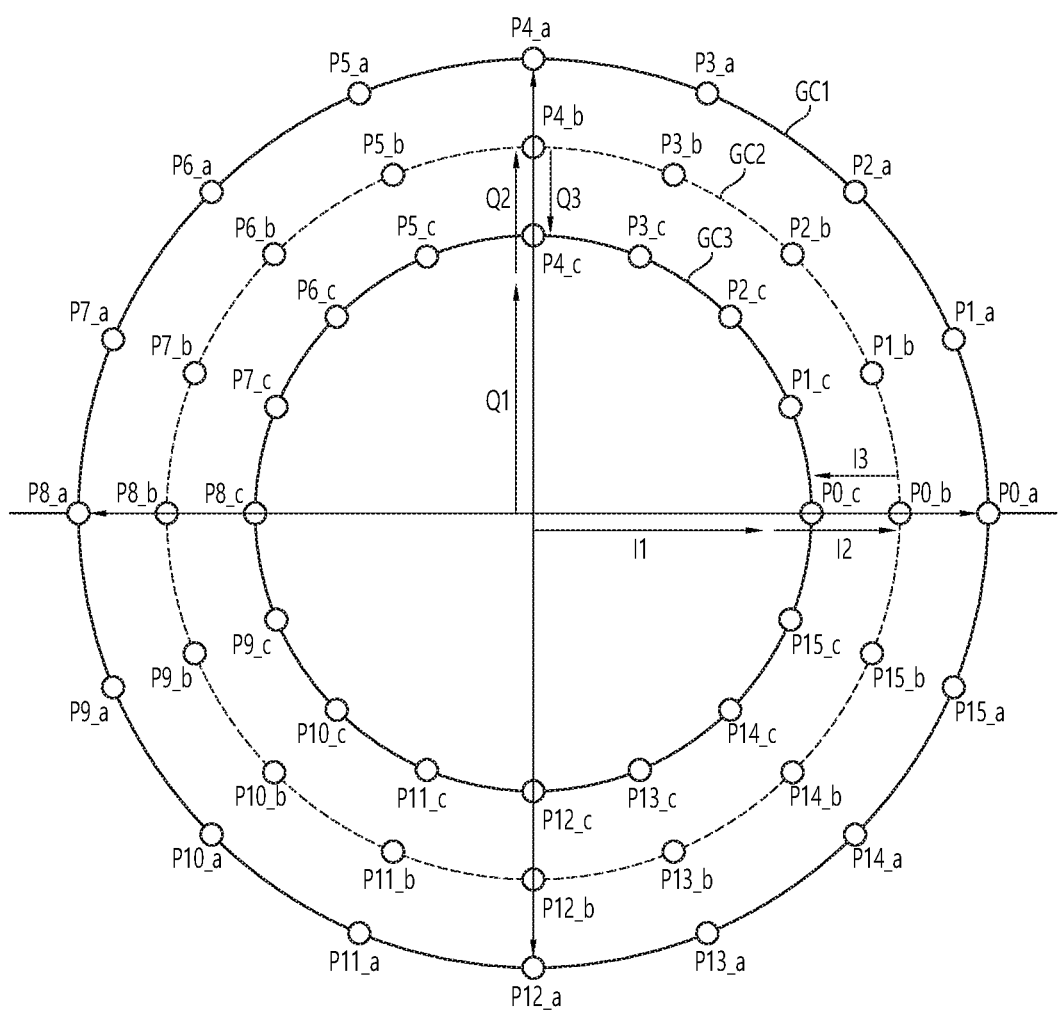
FIG. 10 is a vector diagram of a vector sum circuit according to another embodiment of the present disclosure.

FIG. 10 is a vector diagram of a vector sum circuit according to another embodiment of the present disclosure.

By adjusting the plurality of control signals I_sel1, I_sel1', Q_sel1, Q_sel1", I_sel2, I_sel2', Q_sel2, Q_sel2', I_sel3, and I_sel3' associated with the vector sum circuits of FIGS. 9A to 9C, the phase shifting device according to the present embodiment may generate an output signal RF_OUT having successive phases P0_a to P15_a, P0_b to P15_b, and P0_c to P15_c from 0° to 360° on the first to third gain circles GC1, GC2 and GC3.

The phase shifting device of the present disclosure may generate an output signal RF_OUT having successive phases P0_a to P15_a from 0° to 360° on the first gain circle GCI. The phase shifting device of the present disclosure may generate an output signal RF_OUT having successive phases P0_b to P15_b from 0° to 360° on the second gain circle GC2. The phase shifting device of the present disclosure may generate an output signal RF_OUT having successive phases P0_c to P15_c from 0° to 360° on the third gain circle GC3.

FIG. 10 may be described based the connection relationship of the turned-on transistors of FIGS. 9A to 9C and the size ratio of transistors included in each sub-vector sum circuit assumed above. The first through third in-phase vectors I1, I2, and I3 on the horizontal axis of FIG. 10 may be described as the fifth case mentioned in FIGS. 9A to 9C.

In detail, the first in-phase vector I1 may correspond to the in-phase component I of the first sub-vector sum circuit 130a of FIG. 9A. The second in-phase vector I2 may correspond to the in-phase component I of the second sub-vector sum circuit 130b in FIG. 9B. The third in-phase vector I3 may correspond to the in-phase component I of the third sub-vector sum circuit 130c of FIG. 9C. The first to third quadrature vectors Q1, Q2, and Q3 may be described as the sixth case mentioned in FIGS. 9A to 9C.

In detail, the first quadrature vector Q1 may correspond to the quadrature component Q of the first sub-vector sum circuit 130a of FIG. 9A. The second quadrature vector Q2 may correspond to the quadrature component Q of the second sub-vector sum circuit 130b of FIG. 9B. The third quadrature vector Q3 may correspond to the quadrature component Q of the third sub-vector sum circuit 130c of FIG. 9C. According to the foregoing assumption, the first in-phase vector I1 and the quadrature vector Q1 of FIG. 10 are largest. The sizes of the second in-phase vector I2 and the quadrature vector Q2 are medium. The sizes of the third phase vector I3 and the quadrature vector Directions of the first and second in-phase vectors I1 and I2 of the in-phase component I of FIG. 10 are the same. Also, directions of the first and second quadrature vectors Q1 and Q2 of the quadrature component Q are the same.

However, a direction of the third in-phase vector I3 is opposite to the directions of first and second in-phase vectors I1 and I2. A direction of the third quadrature vector Q3 is opposite to those of the first and second quadrature vectors Q1 and Q2.

The phase shifting device of the present invention may adjust a size and a direction of an output component of the sub-vector sum circuit, an individual module. That is, a signal output from the phase shifting device of the present specification may be adjusted not only in phase but also in a gain. As mentioned above, a magnitude of the total current flowing in the vector sum circuit of FIGS. 9A to 9C is maintained uniformly. Thus, a magnitude of impedance of the phase shifting device viewed from the outside of the embodiment of the present invention is maintained constant. Accordingly, the phase shifting device of the present invention has an advantage in that it is easy to match impedance with a next stage.

In addition, the phase shifting device according to the embodiment of the present invention may be advantageous in terms of integration and miniaturization since a device such as an additional attenuator or variable gain amplifier (VGA) is not required.

FIG. 11 is a vector diagram of a phase shifting device according to another embodiment of the present disclosure. (a) of FIG. 11 shows a vector diagram of a conventional phase shifting device. A signal having a phase component of 0° to 360° on a gain circle GC may be generated by adjusting a current of the in-phase component I and the quadrature component Q.

The phase shifting device of (b) of FIG. 11 has a modified gain circle GC'. By rotating the conventional gain circle by 11.25°, it is possible to prevent a situation where a magnitude of the current of the in-phase component I or the current of the quadrature component Q is '0'. For example, in order to generate a signal having a phase of 0° of (a) of FIG. 11, the current of the quadrature component Q is 0 mA. A variation in the input impedance due to this causes a phase error and a gain error.

In contrast, if the gain circle is rotated (e.g., 11.25°) as in the phase shifting device of (b) of FIG. 11, a case where 0 mA flows in a current of the in-phase component I or a current of the quadrature component Q may be prevented. Thus, the phase shifting device according to one embodiment of the present disclosure has improved accuracy in terms of phase and gain.

The embodiment of (b) of FIG. 11 of the present disclosure is only an example, and it may be understood that the present disclosure includes another embodiment in which a magnitude of a current the in-phase component I or the quadrature component Q is prevented from becoming '0' by rotating the gain circle of the phase shifting device.

Figure 12:
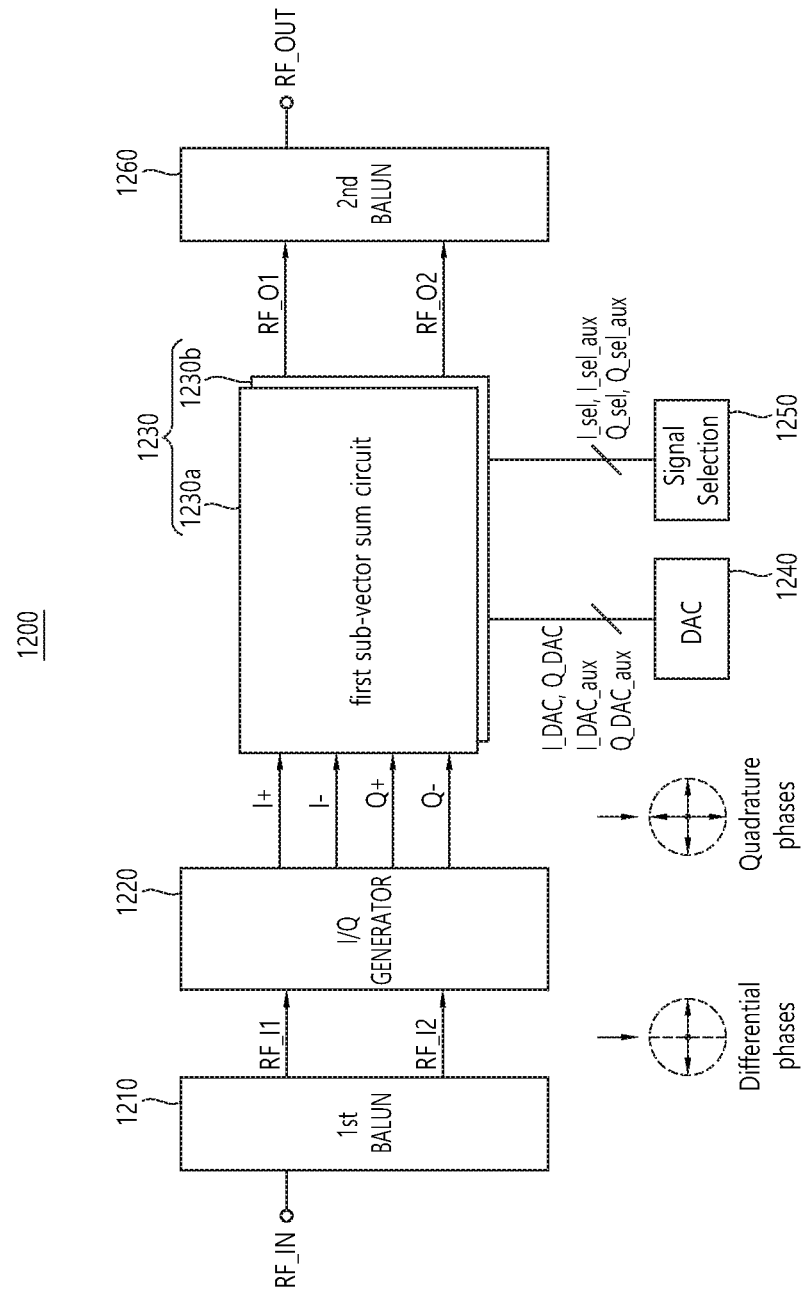
FIG. 12 is a block diagram illustrating a vector sum type phase shifting device according to another embodiment of the present disclosure.

FIG. 12 is a block diagram illustrating a vector sum type phase shifting device according to another embodiment of the present disclosure.

Referring to FIG. 12, a phase shifting device 1200 may include a first balun 1210, an I/Q generator 1220, a vector sum circuit 1230, a DAC circuit 1240, a signal selection circuit 1250, and a second balun 1260.

The first balun 1210 may output first and second differential input signals RF_I1 and RF_I2 based on an input signal RF_IN. For example, the first and second differential input signals RF_I1 and RF_I2 have a phase difference of 180°. The I/Q generator 1220 may generate first to fourth phase signals having a phase difference of 90° based on the differential signals RF_I1 and RF_I2. For example, the first phase signal I+ has a phase of 0°, and the second phase signal I− has a phase of 180°. The third phase signal Q+ has a phase of 90°, and the fourth phase signal Q− has a phase of 270°.

The vector sup circuit 1230 may output first and second differential output signals RF_O1 and RF_O2 based on first to fourth phase signals I+, I−, Q+, and Q− according to a plurality of control signals I_DAC, Q_DAC, I_DAC_aux, Q_DAC_aux, I_sel, Q_sel, I_sel_aux, and Q_sel_aux.

The vector sum circuit 1230 of FIG. 12 may include first and second sub-vector sum circuits 1230a and 1230b. In-phase (I) currents output through the first and second sub-vector sum circuits 1230a and 1230b of FIG. 12 may be set individually. Quadrature (Q) currents output through the first and second sub-vector sum circuits 1230a and 1230b of FIG. 12 may be set individually.

That is, the first n second sub-vector sum circuits 1230a and 1230b of FIG. 12 may be individually controlled according to control signals. The first sub-vector sum circuit 1230a of FIG. 12 may be controlled based on the in-phase select signal and the quadrature select signal Q_sel.

The second sub-vector sum circuit 1230b may be controlled based on the in-phase auxiliary select signal sel_aux and the quadrature auxiliary select signal Q_sel_aux. Internal structures of the first and second sub-vector sum circuits 1230a and 1230b will be described in more detail with reference to the accompanying drawings hereinafter.

The DAC circuit 1240 may output the first and second control signals I_DAC and Q_DAC and the first and second auxiliary control signals I_DAC_aux and Q_DAC_aux to the vector sum circuit 1230. The signal selection circuit 1250 may output a plurality of select signals I_sel, Q_sel, I_sel_aux, and Q_sel_aux to the vector sum circuit 1230.

The second balun 1260 may generate an output signal RF_OUT based on the first and second differential output signals RF_O1 and RF___O2.

Figure 13:
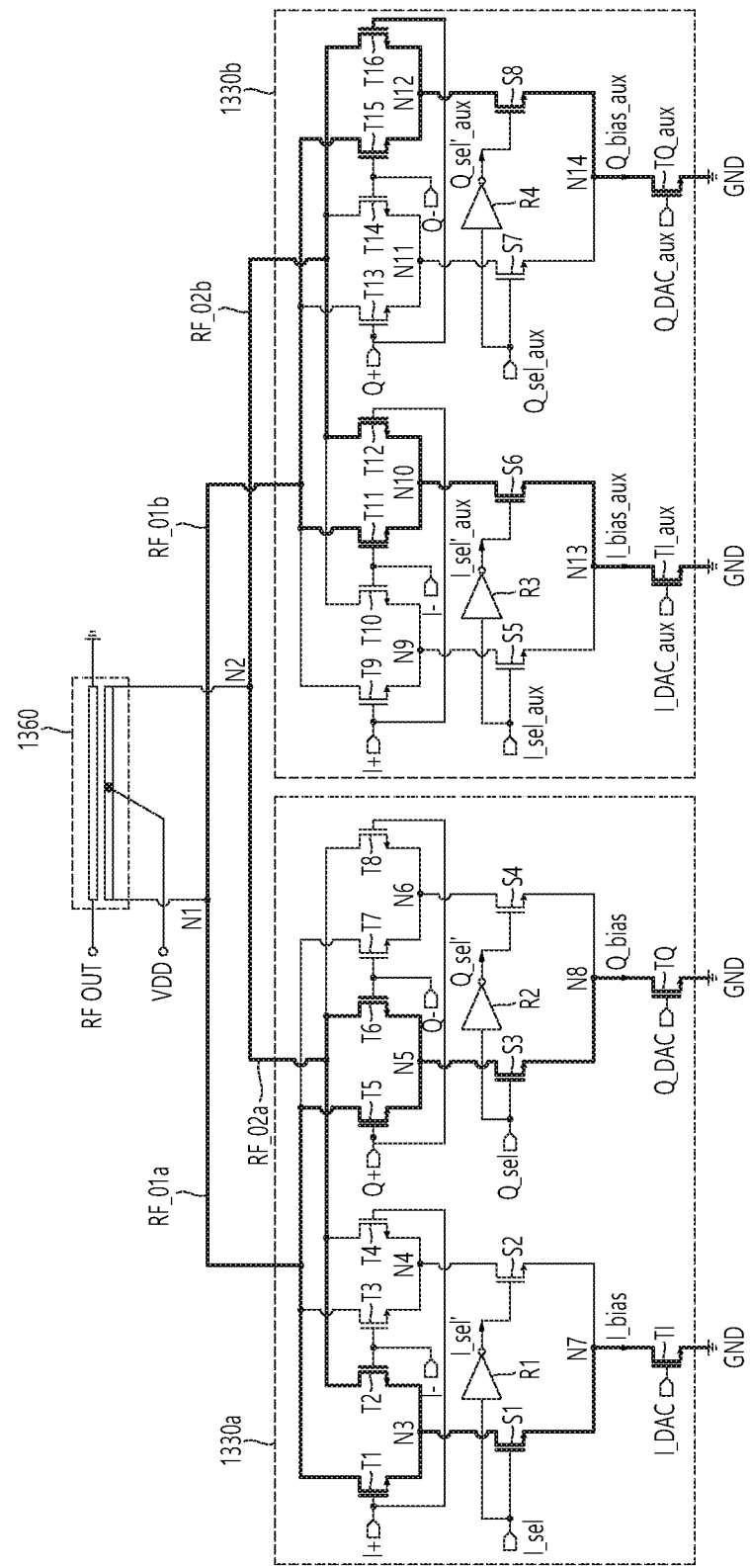
FIG. 13 is a view illustrating the entire structure of a vector sum circuit according to another embodiment of the present disclosure.

FIG. 13 is a view illustrating the entire structure of a vector sum circuit according to another embodiment of the present disclosure.

A first sub-vector sum circuit 1330a of FIG. 13 may include an in-phase transistor TI and a quadrature transistor TQ. The first sub-vector sum circuit 1330a of FIG. 13 corresponds to the first sub-vector sum circuit 1230a in FIG. 12.

One end of the in-phase transistor TI is connected to the seventh node N7 and the other end thereof is connected to the ground node GND. Also, the first control signal I_DAC is applied to a gate of the in-phase transistor TI.

A magnitude of the in-phase bias current I_bias flowing at one end of the in-phase transistor TI may be controlled according to signal levels of the first control signal I_DAC. For example, as the signal level of the first control signal I_DAC increases, the magnitude of the in-phase bias current I_bias may increase.

One end of the quadrature transistor connected to the eighth node N8 and the other end thereof is connected to the ground node GND. Also, the second control signal Q_DAC is applied to a gate of the quadrature transistor TQ A magnitude of the quadrature bias current Q_bias flowing at one end of the quadrature transistor TQ may be controlled according to signal levels of the second control signal Q_DAC. For example, as the signal level of the second control signal Q_DAC increases, the magnitude of the quadrature bias current Q_bias may increase.

The first sub-vector sum circuit 1330*a* may include first to eighth transistors T1 through T8 corresponding to the first through fourth phase signals I+, I−, Q+, and Q−.

The first sub-vector sum circuit 1330*a* may include first and second selection transistors S1 and S2 corresponding to the in-phase select signal I_sel and the in-phase inversion select signal I_sel'. The first sub-vector sum circuit 1330*a* may include third and fourth selection transistors S3 and S4 corresponding to the quadrature select signal Q_sel and the quadrature inversion select signal Q_sel'.

One end of the first transistor T1 is connected to the first node N1, and the other end thereof is connected to the third node NI The first phase signal I+ is applied to the gate of the first transistor T1. One end of the second transistor T2 is connected to the second node N2 and the other end thereof is connected to the third node N3. The second phase signal I− is applied to the gate of the second transistor T2.

One end of the third transistor T3 is connected to the first node Ni and the other end thereof is connected to the fourth node N4. The second phase signal I− is applied to the gate of the third transistor T3. One end of the fourth transistor T4 is connected to the second node N2 and the other end thereof is connected to the fourth node N4. The first phase signal I+ is applied to the gate of the fourth transistor T4.

One end of the fifth transistor T5 is connected to the first node N1 and the other end thereof is connected to the fifth node N5. The third phase signal Q+ is applied to the gate of the fifth transistor T5. One end of the sixth transistor T6 is connected to the second node N2 and the other end thereof is connected to the fifth node N5. The fourth phase signal Q− is applied to the gate of the sixth transistor T6.

One end of the seventh transistor T7 is connected to the first node N1 and the other end thereof is connected to the sixth node N6. The fourth phase signal Q− is applied to the gate of the seventh transistor T7. One end of the eighth transistor T8 is connected to the second node N2 and the other end thereof is connected to the sixth node N6. The third phase signal Q4+ is applied to the gate of the eighth transistor T8.

One end of the first selection transistor S1 is connected to the third node N3 and the other end thereof is connected to the seventh node N7. The in-phase select signal I_sel is applied to the gate of the first selection transistor S1.

One end of the second selection transistor S2 is connected to the fourth node N4, and the other end thereof is connected to the seventh node N7. The in-phase inversion select signal I_sel', an output signal from the first inverter R1, is applied to the gate of the second selection transistor S2.

Whether to turn on the first selection transistor S1 may be determined according to signal levels of the in-phase select signal I_sel. Whether to turn on the second selection transistor S2 may be determined according to signal levels of the in-phase inversion select signal I_sel'.

For example, the in-phase select signal I_sel may be a high-level signal, and the in-phase inversion select signal I_sel' may be a low-level signal. Thus, the first selection transistor S1 is turned on and the second selection transistor S2 is turned off.

Conversely, the in-phase select signal I_sel may be a low-level signal, and the quadrature inversion select signal Q_sel' may be a high-level signal. Accordingly, the first selection transistor S1 is turned off Id the second selection transistor S2 is turned on.

One end of the third selection transistor S3 is connected to the fifth node N5 and the other end thereof is connected to the eighth node N8. The quadrature select signal Q_sel is applied to the gate third selection transistor S3.

One end of the fourth selection transistor S4 is connected to the sixth node N6 and the other end thereof is connected to the eighth node N8. Also, the quadrature inversion select signal Q_sel', an output signal from the second inverter R2, is applied to the gate of the fourth selection transistor S4.

Whether to turn on the third selection transistor S3 is determined according to signal levels of the quadrature select signal Whether to turn on the fourth selection transistor S4 is determined according to signal levels of the output signal Q_sel' of the second inverter R2.

For example, the quadrature select signal Q_sel may be a high-level signal, and the quadrature inversion select signal Q_sel' may be a low-level signal. Thus, the third selection transistor S3 is turned on and the fourth selection transistor S4 is turned off.

On the contrary, the first quadrature select signal Q_sel may be a low-level signal and the quadrature inversion select signal Q_sel' may be a high-level signal. Accordingly, the third selection transistor S3 is turned off and the fourth selection transistor S4 is turned on.

The first node N1 is a point where one end of the first transistor T1, one end of the third transistor T3, one end of the fifth transistor T5, and one end of the seventh transistor T7 intersect. The second node N2 is a point where one end of the second transistor T2, one end of the fourth transistor T4, one end of the sixth transistor T6, and one end of the eighth transistor T8 intersect.

The third node N3 is a point where the other end of the first transistor T1, the other end of the second transistor T2, and one end of the first selection transistor S1 intersect. The fourth node N4 is a point where the other end of the third transistor T3, the other end of the fourth transistor T4, and one end of the second selection transistor S2 intersect.

The fifth node N5 is a point where the other end of the fifth transistor T5, the other end of the sixth transistor T6, and one end of the third selection transistor S3 intersect. The sixth node N6 is a point There the other end of the seventh transistor T7, the other end of the eighth transistor T8, and one end of the fourth selection transistor S4 intersect.

The seventh node N7 is a point where the other end of the first selection transistor 51, the other end of the second selection transistor S2, and one end of the in-phase transistor TI intersect. The eighth node N8 is a point where the other end of the third selection transistor S3, the other end of the fourth selection transistor S4, and one end of the quadrature transistor TQ intersect.

Referring to FIGS. 1 to 13, the first and second sub-vector sum circuits 1330*a* and 1330*b* may be understood as individual modules. It may be understood that the description of the connection relationship of the transistors included in the first sub-vector sum circuit 1330*a* of FIG. 13 is applied to the description of the connection relationship of the transistors included in the second sub-vector sum circuit 1330*b*.

The second sub-vector sum circuit 1330*b* of FIG. 13 may include an in-phase auxiliary transistor 11 aux and a quadrature auxiliary transistor TQ_aux. The second sub-vector sum circuit 1330*b* in FIG. 13 corresponds to the second sub-vector sum circuit 1230*b* of FIG. 12.

One end of the in-phase auxiliary transistor TI_aux in FIG. 13 is connected to the thirteenth node N13 and the other end thereof is connected to the ground node GNU. The first auxiliary control signal I_DAC_aux is applied to a gate of the in-phase auxiliary transistor TI_aux.

A magnitude of the in-phase bias auxiliary current I_bias_aux flowing at one end of the in-phase auxiliary transistor TI_aux may be controlled according to signal levels of the first auxiliary control signal I_DAC_aux. For example, as the signal level of the first auxiliary control signal I_DAC_aux increases, the magnitude of the in-phase bias auxiliary current I_bias_aux may increase.

One end of the quadrature auxiliary transistor TQ_aux of FIG. 13 is connected to the fourteenth node N14 and the other end thereof s connected to the ground node GND. The second auxiliary control signal Q_DAC_aux is applied to a gate of the quadrature auxiliary transistor TQ_aux.

A magnitude of the quadrature auxiliary bias current Q_bias_aux flowing at one end of the quadrature auxiliary transistor TQ_aux may be controlled according to signal levels of the second auxiliary control signal Q_DAC_aux. For example, as the signal level of the second auxiliary control signal Q_DAC_aux increases, the magnitude of the quadrature auxiliary bias current Q_bias_aux may increase.

The in-phase transistor TI, the quadrature transistor TQ, the in-phase auxiliary transistor TI_aux, and the quadrature auxiliary transistor TQ_aux of FIG. 13 may be understood as separate current sources.

In addition, a magnitude of the current vector obtained by adding the in-phase bias current I_bias, the quadrature bias current Q_bias, the in-phase bias auxiliary current I_bias aux, and the quadrature bias auxiliary current Q_bias_aux is constant.

In addition, the size of the transistors included in each sub-vector sum circuit may be associated with a magnitude of a signal output from each sub-vector sum circuit. A gate width of the transistors included in the first sub-vector sum circuit 1330*a* of FIG. 13 may be greater than a gate width of the transistors of the second sub-vector sum circuit 1330*b* located at the same position.

For example, a gate width of the first transistor T1 of the first sub-vector sum circuit 1330*a* may be greater than a gate width of the transistor T9 of the second sub-vector sum circuit 1330*b*. A gate width of the in-phase transistor TI of the first sub-vector sum circuit 1330*a* may be greater than a gate width of the in-phase auxiliary transistor TI_aux of the second sub-vector sum circuit 1330*b*.

In the first sub-vector sum circuit 1330*a*, the first control signal I_DAC is applied to the gate of the in-phase transistor TI. The second control signal Q_DAC is applied to the gate of the quadrature auxiliary transistor TQ. Magnitudes of the currents I_bias and Q_bias flowing at one ends of the in-phase transistor TI and the quadrature transistor TQ may be determined based on the first control signal I_DAC and the second control signal Q_DAC. In the second sub-vector sum circuit 1330*b*, the first auxiliary control signal I_DAC_aux is applied to the gate of the in-phase auxiliary transistor TI_aux. The second auxiliary control signal Q_DAC_aux is applied to the gate of the quadrature auxiliary transistor TQ_aux.

Magnitudes of the currents I_bias_aux and Q_bias_aux flowing at one ends of the phase auxiliary transistor TI_aux and the quadrature auxiliary transistor TQ_aux may be determined based on the first auxiliary control signal I_DAC_aux and the second auxiliary control signal Q_DAC_aux.

In a seventh case, it is assumed that, in the first sub-vector sum circuit 1330*a*, the second control signal Q_DAC is applied with a magnitude of '0'. Accordingly, the current Q_bias does not flow at one end of the quadrature transistor TQ.

It is also assumed that the second auxiliary control signal Q_DAC_aux is applied with a magnitude of '0'. Accordingly, the current Q_bias aux does not flow at one end of the quadrature auxiliary transistor TQ_aux.

In the seventh case, it may be understood that, since the magnitudes of the second control signal Q_DAC and the second auxiliary control signal Q_DAC_aux are '0', an output signal RF_OUT is determined, regardless of level of the select signals Q_sel, Q_sel', Q_sel _aux, and Q_sel_aux' associated with a quadrature component.

In the first sub-vector sum circuit 130*a*, it is assumed that a high-level in-phase select signal I_sel is applied to the gate of the first selection transistor S1. The remaining select signal I_sel' may be a low-level signal.

Since the first selection transistor S1 is turned on, the first transistor T1 and the second transistor T2 may be selected. Accordingly, the first transistor T1 may transmit a signal generated based on the first phase signal to the first output terminal RF_O1. The second transistor T2 may transmit a signal generated based on the second phase signal I– to the second output terminal RF_O2.

In the second sub-vector sum circuit 1330*b*, a low-level in-phase auxiliary select signal I_sel_aux is applied. Accordingly, the high-level in-phase auxiliary inversion select signal I_sel_aux' is applied to the gate of the sixth selection transistor S6.

Since the sixth selection transistor S6 is turned on, the eleventh transistor T11 and the twelfth transistor T12 may be selected. Accordingly, the eleventh transistor T11 may transmit a signal generated based on the second phase signal I– to the third output terminal RF_O1*b*. The twelfth transistor T12 may transmit a signal generated based on the first phase signal I+ to the fourth output terminal RF_O2*b*.

In an eighth case, in the first sub-vector sum circuit 1330*a*, it is assumed that the first control signal I_DAC is applied with a magnitude of '0'. Accordingly, the current I_bias does not flow at one end of the in-phase transistor TI.

It is also assumed that the first auxiliary control signal I_DAC_aux is applied with a magnitude of '0'. Accordingly, the current I_bias_aux does not flow at one end of the in-phase auxiliary transistor T_I aux.

In the eighth case, it may be understood that, since the magnitudes of the first control signal I_DAC and the first auxiliary control signal I_DAC_aux are '0'. an output signal RF_OUT is determined, regardless of the select signals I_sel_aux, I_sel', and I_sel_aux' associated with an in-phase component, In the first sub-vector sum circuit 130*a*, it is assumed that a high-level quadrature select signal Q_sel is applied to the gate of the third selection transistor S3. The remaining select signal Q_sel' may be a low-level signal.

Since the third selection transistor S3 is turned on, the fifth transistor T5 and the sixth transistor T6 may be selected. Accordingly, the fifth transistor T5 may transmit a signal generated based on the, third phase signal Q+ to the first output terminal RF_O1*a*. In addition, the sixth transistor T6 may transmit a signal generated based on the fourth phase signal Q– to the second output terminal RF_O2*a*.

In the second sub-vector sum circuit 130*b*, it is assumed that a high-level quadrature auxiliary inversion select signal Q_sel_aux' is applied to the gate of the eighth selection transistor S8. The remaining select signal Q_sel_aux may be a low-level signal.

Since the eighth selection transistor S8 is turned on, the fifteenth transistor T15 and the sixteenth transistor T16 may be selected. Accordingly, the fifteenth transistor T15 may transmit a signal generated based on the fourth phase signal Q– to the third output terminal RF_O1*b*. Also, the sixteenth transistor T16 may transmit a signal generated based on the third phase signal Q+ to the fourth output terminal R_02*b*. The second balun 1360 of FIG. 13 may be connected to a power source voltage VDD. The second balun 1360 may output an output signal RF_OUT based on signals transmitted first and second output terminals RF_O1*a* and RF_O2*a* of the first sub-vector sum circuit 1330*a* and the third and fourth output terminals RF_O1*b* and RF_O2*b* of the second sub-vector sum circuit 1330*b*.

Figure 14:
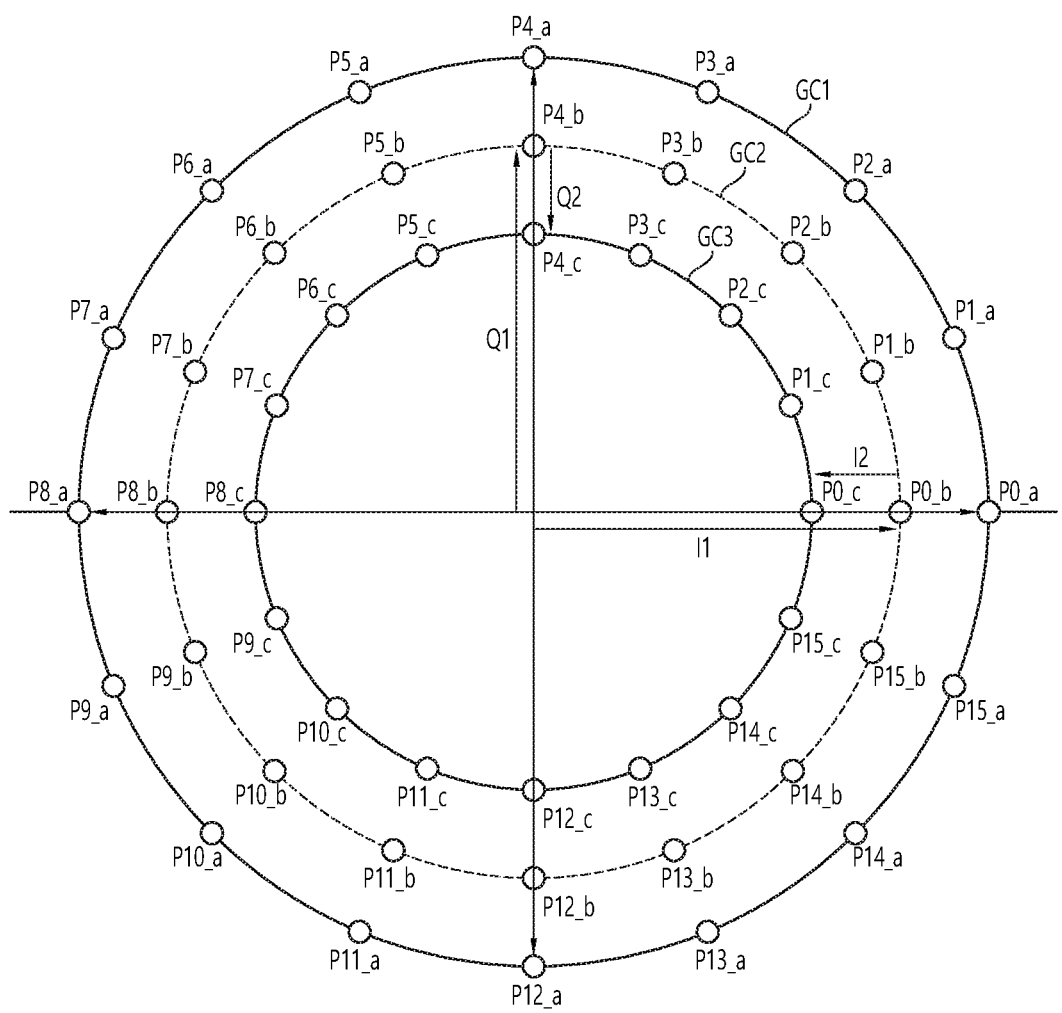
FIG. 14 is a vector diagram of a vector sum circuit according to another embodiment of the present disclosure.

FIG. 14 is a vector diagram of a vector sum circuit according to another embodiment of the present disclosure.

The phase shifting device according to the present embodiment may generate an output signal RF_OUT having successive phases P0_*a* to P15_*a*, P0_*b* to P15_*b*, and P0_*c* to P15_*c* from 0° to 360° on first to third gain circles GC1, GC2, and GC3 based on the plurality of control signals I_sel, I_sel', Q_sel, Q_sel', I_sel_aux, I_sel2_aux', Q_sel_aux, Q_sel_aux', I_DAC, Q_DAC, I_DAC_aux, and Q_DAC_aux. The first and second in-phase vectors I1 and I2 of the horizontal axis of FIG. 14 may be described based on the seventh case mentioned in FIG. 13.

In detail, the first in-phase vector I1 may correspond to the in-phase component I of the first sub-vector sum circuit 1330*a* of FIG. 13. The second in-phase vector I2 may correspond to the in-phase component I of the second sub-vector sum circuit 1330*b* of FIG. 13. The first and second quadrature vectors Q1 and Q2 of the vertical axis in FIG. 14 may described based on the second case mentioned in FIG. 13.

In detail, the first quadrature vector Q1 may correspond to the quadrature component Q of the first sub-vector sum circuit 1330*a* of FIG. 13. The second quadrature vector Q2 may correspond to the quadrature component Q of the second sub-vector sum circuit 1330*b* of FIG. 13.

Although the first to third gain circles GC1, GC2 and GC3 are illustrated in FIG. 14, the phase shifting device according to the embodiment of FIGS. 12 and 13 may generate a signal on gain circles shown) having radiuses having various sizes within the first gain circle CG1.

Specific embodiments have been described in the detailed description of the present invention. However, various modifications may be made without departing from the scope of the present invention. Technical concepts of the present invention should not be determined to be limited to the described embodiments of the present disclosure but be determined by claims and equivalents thereof, as well as claims.

According to an embodiment of the present disclosure, the phase shifting device having enhanced integration and improved operating characteristics is provided.

What is claimed is:

1. A phase shifting device comprising:
a first balun outputting first and second differential input signals based on an input signal;
an I/Q generator outputting first to fourth phase signals based on the first and second differential input signals;
a control circuit outputting a first control signal, a second control signal, a plurality of in-phase select signals, and a plurality of quadrature select signals;
a current source circuit including a first source transistor outputting an in-phase current according to the first control signal and a second source transistor outputting a quadrature current according to the second control signal;
a vector sum circuit including a plurality of sub-vector sum circuits and outputting first and second differential output signals based on the first to fourth phase signals according to the plurality of in-phase select signals and the plurality of quadrature select signals; and
a second balun outputting an output signal based on the first and second differential output signals.

2. The phase shifting device of claim 1, wherein
the control circuit uniformly maintains a magnitude of a signal obtained by adding the in-phase current and the quadrature current based on the in-phase control signal and the quadrature control signal.

3. The phase shifting device of claim 1, wherein
a vector obtained by adding the in-phase current and the quadrature current is the same in size and opposite in direction with a vector obtained by adding the first differential output signal and the second differential output signal.

4. The phase shifting device of claim 1, wherein
the vector sum circuit includes:
a first sub-vector sum circuit outputting a signal generated based on a first in-phase select signal, a first quadrature select signal, and the first to fourth phase signals to the second balun through first and second output terminals;
a second sub-vector sum circuit outputting a signal generated based on a second in-phase select signal, a second quadrature select signal, and the first to fourth phase signals to the second balun through third and fourth output terminals; and
a third sub-vector sum circuit outputting a signal generated based on a third in-phase select signal, a third quadrature select signal, and the first to fourth phase signals to the second balun through fifth and sixth output terminals.

5. The phase shifting device of claim 4, wherein
the first sub-vector sum circuit includes:
a first transistor having one end connected to the first output terminal and having a gate to which the first phase signal is applied;
a second transistor having one end connected to the second output terminal and having a gate to which the second phase signal is applied;
a third transistor having one end connected to the first output terminal and having a gate to which the second phase signal is applied;
a fourth transistor having one end connected to the second output terminal and having a gate to which the first phase signal is applied;
a first inverter outputting a first in-phase inversion select signal obtained by inverting the first in-phase select signal;
a first selection transistor having one end connected to the other ends of the first and second transistors and the other end connected to one end of the first source transistor, and turned on according to the first in-phase select signal applied to a gate thereof; and
a second selection transistor having one end connected to the other ends of the third and fourth transistors and the other end connected to the one end of the first source transistor, and turned on according to the first in-phase inversion select signal applied to a gate thereof.

6. The phase shifting device of claim 5, wherein
the first sub-vector sum circuit includes:
a fifth transistor having one end connected to the first output terminal and having a gate to which the third phase signal is applied;
a sixth transistor having one end connected to the second output terminal and having a gate to which the fourth phase signal is applied;
a seventh transistor having one end connected to the first output terminal and having a gate to which the fourth phase signal is applied;

an eighth transistor having one end connected to the second output terminal and having a gate to which the third phase signal is applied;

a second inverter outputting a first quadrature inversion select signal obtained by inverting the first quadrature select signal;

a third selection transistor having one end connected to the other ends of the fifth and sixth transistors and the other end connected to one end of the second source transistor, and turned on according to the first quadrature select signal applied to a gate thereof; and a fourth selection transistor having one end connected to the other ends of the seventh and eighth transistors and the other end connected to the one end of the second source transistor, and turned on according to the first quadrature inversion select signal applied to a gate thereof.

7. The phase shifting device of claim 1, wherein the plurality of sub-vector sum circuits have a preset size ratio, and the size ratio is determined according to a ratio of a gate width of a transistor individually included in the plurality of sub-vector sum circuits.

8. The phase shifting device of claim 4, wherein the first differential output signal is a signal obtained by combining a first signal transmitted through the first output terminal, a third signal transmitted through the third output terminal, and a fifth signal transmitted through the fifth output terminal, and the second differential output signal is a signal obtained by combining a second signal transmitted through the second output terminal, a fourth signal transmitted through the fourth output terminal, and a sixth signal transmitted through the sixth output terminal.

9. The phase shifting device of claim 1, wherein the other end of the first source transistor and the other end of the second source transistor are connected to a ground voltage.

10. The phase shifting device of claim 1, wherein the first differential input signal is a signal having a phase difference of 180° from the second differential input signal, and the first phase signal is a signal having a phase difference of 180° from the second phase signal, a signal having a phase difference of 90° from the third phase signal, and a signal having a phase difference of 270° from the fourth phase signal.

11. A method for a phase shifting device, the method comprising:

outputting, by the phase shifting device, first and second differential input signals based on an input signal, the phase shifting device including a plurality of sub-vector sum circuits;

outputting, by the phase shifting device, first to fourth phase signals based on the first and second differential input signals;

receiving, by the phase shifting device, a first control signal, a second control signal, a plurality of in-phase select signals, and a plurality of quadrature select signals;

outputting, by the phase shifting device, an in-phase current according to the first control signal, and outputting, by the phase shifting device, a quadrature current according to the second control signal;

outputting, by the phase shifting device, first and second differential output signals based on the first to fourth phase signals according to the plurality of in-phase select signals and the plurality of quadrature select signals; and outputting an output signal based on the first and second differential output signals.

* * * * *